US012614677B2

(12) United States Patent
   Berolini

(10) Patent No.: US 12,614,677 B2
(45) Date of Patent: Apr. 28, 2026

(54) MULTILAYER CAPACITOR

(71) Applicant: KYOCERA AVX Components Corporation, Fountain Inn, SC (US)

(72) Inventor: Marianne Berolini, Greer, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 180 days.

(21) Appl. No.: 18/494,801

(22) Filed: Oct. 26, 2023

(65) Prior Publication Data

US 2024/0145176 A1     May 2, 2024

Related U.S. Application Data

(60) Provisional application No. 63/420,726, filed on Oct. 31, 2022.

(51) Int. Cl.
   *H01G 4/30*       (2006.01)
   *H01G 2/06*       (2006.01)
      (Continued)

(52) U.S. Cl.
   CPC .................. *H01G 4/30* (2013.01); *H01G 2/06* (2013.01); *H01G 4/012* (2013.01);
      (Continued)

(58) Field of Classification Search
   CPC ............ H01G 4/30; H01G 2/06; H01G 4/012; H01G 4/1218; H01G 4/232; H05K 1/181; H05K 2201/10015
   See application file for complete search history.

(56) References Cited

U.S. PATENT DOCUMENTS 4,831,494 A     5/1989  Arnold et al.
5,583,738 A    12/1996  Kohno
      (Continued)

FOREIGN PATENT DOCUMENTS

EP     2689455 B1    8/2016
EP     2614521 B1    1/2018
      (Continued)

OTHER PUBLICATIONS

AVX, LGA Low Inductance Capacitors 0204/0306 Land Grid Array, p. 85-86.
      (Continued)

*Primary Examiner* — Michael P McFadden
(74) *Attorney, Agent, or Firm* — Dority & Manning, P.A.

(57) ABSTRACT

The present invention is directed to a multilayer capacitor, a circuit board containing the multilayer capacitor, and an integrated circuit package containing the multilayer capacitor. A multilayer capacitor a body containing alternating dielectric layers and electrode layers. Each electrode layer includes a first electrode having a base, connecting, and central sections; a first connecting edge extending from a first leading edge of the base section to a first edge of the central section; and a second connecting edge extending from a second leading edge of the base section to a second edge of the central section. At least a portion of at least one of the first connecting edge or the second connecting edge of the first electrode of the electrode layers is not perpendicular to the respective first edge or second edge of the central section of the first electrode.

48 Claims, 18 Drawing Sheets

(51) Int. Cl.

| | | |
|---|---|---|
| *H01G 4/012* | (2006.01) | |
| *H01G 4/12* | (2006.01) | |
| *H01G 4/232* | (2006.01) | |
| *H05K 1/18* | (2006.01) | |
| *H05K 1/181* | (2026.01) | |

(52) U.S. Cl.

CPC ........... *H01G 4/1218* (2013.01); *H01G 4/232* (2013.01); *H05K 1/181* (2013.01); *H05K 2201/10015* (2013.01)

(56) References Cited

U.S. PATENT DOCUMENTS

| | | | |
|---|---|---|---|
| 5,880,925 | A | 3/1999 | DuPre et al. |
| 6,034,864 | A | 3/2000 | Naito et al. |
| 6,075,285 | A | 6/2000 | Taylor et al. |
| 6,243,253 | B1 | 6/2001 | DuPre et al. |
| 6,292,351 | B1 | 9/2001 | Ahiko et al. |
| 6,407,907 | B1 | 6/2002 | Ahiko et al. |
| 6,430,059 | B1 | 8/2002 | Hung et al. |
| 6,456,561 | B2 | 9/2002 | Maeda |
| 6,459,561 | B1 | 10/2002 | Galvagni et al. |
| 6,477,032 | B2 | 11/2002 | Makl, Jr. |
| 6,496,355 | B1 | 12/2002 | Galvagni et al. |
| 6,532,143 | B2 | 3/2003 | Figueroa et al. |
| 6,594,136 | B2 | 7/2003 | Kuroda et al. |
| 6,606,237 | B1 | 8/2003 | Naito et al. |
| 6,664,628 | B2 | 12/2003 | Khandros et al. |
| 6,752,152 | B2 | 6/2004 | Gale et al. |
| 6,757,152 | B2 | 6/2004 | Galvagni et al. |
| 6,795,294 | B2 | 9/2004 | Kuroda et al. |
| 6,795,295 | B2 | 9/2004 | Murakami et al. |
| 6,816,356 | B2 | 11/2004 | Devoe et al. |
| 6,829,134 | B2 | 12/2004 | Yamauchi et al. |
| 6,898,070 | B2 | 5/2005 | Korony et al. |
| 6,909,593 | B2 | 6/2005 | Kuroda et al. |
| 6,950,300 | B2 | 9/2005 | Sutardja |
| 6,960,366 | B2 | 11/2005 | Ritter et al. |
| 6,970,362 | B1 | 11/2005 | Chakravorty |
| 7,068,490 | B2 | 6/2006 | Prymak |
| 7,149,072 | B2 | 12/2006 | Lee et al. |
| 7,170,737 | B2 | 1/2007 | MacNeal et al. |
| 7,177,137 | B2 | 2/2007 | Ritter et al. |
| 7,230,816 | B2 | 6/2007 | Sutardja |
| 7,251,116 | B2 | 7/2007 | Roy |
| 7,280,342 | B1 | 10/2007 | Randall et al. |
| 7,310,217 | B2 | 12/2007 | Takashima et al. |
| 7,317,622 | B2 | 1/2008 | Li |
| 7,327,554 | B2 | 2/2008 | Otsuka et al. |
| 7,365,957 | B2 | 4/2008 | Togashi et al. |
| 7,394,645 | B2 | 7/2008 | Takahashi |
| 7,414,857 | B2 | 8/2008 | Ritter et al. |
| 7,417,857 | B2 | 8/2008 | Rondier et al. |
| 7,463,474 | B2 | 12/2008 | Ritter et al. |
| 7,545,623 | B2 | 6/2009 | Randall et al. |
| 7,573,698 | B2 | 8/2009 | Eggerding et al. |
| 7,576,968 | B2 | 8/2009 | Ritter et al. |
| 7,633,739 | B2 | 12/2009 | Devoe |
| 7,662,430 | B2 | 2/2010 | Satou |
| 7,667,950 | B2 | 2/2010 | Togashi |
| 7,672,112 | B2 | 3/2010 | Hattori et al. |
| 7,697,262 | B2 | 4/2010 | Ritter et al. |
| 7,701,695 | B2 | 4/2010 | Sutardja |
| 7,715,171 | B2 | 5/2010 | Nakano et al. |
| 7,724,496 | B2 | 5/2010 | Eggerding et al. |
| 7,724,498 | B2 | 5/2010 | Mosley et al. |
| 7,732,296 | B2 | 6/2010 | Park et al. |
| 7,733,628 | B2 | 6/2010 | Lee et al. |
| 7,737,563 | B2 | 6/2010 | Su et al. |
| 7,791,192 | B1 | 9/2010 | Joshi et al. |
| 7,897,433 | B2 | 3/2011 | Su et al. |
| 7,958,627 | B2 | 6/2011 | Randall et al. |
| 7,961,453 | B2 | 6/2011 | Lee et al. |
| 7,990,677 | B2 | 8/2011 | Lee et al. |
| 8,004,820 | B2 | 8/2011 | Itamura |
| 8,045,319 | B2 | 10/2011 | Ritter et al. |
| 8,054,607 | B2 | 11/2011 | Lee et al. |
| 8,084,297 | B1 | 12/2011 | Joshi et al. |
| 8,111,524 | B2 | 2/2012 | Randall et al. |
| 8,159,813 | B2 | 4/2012 | Lee et al. |
| 8,193,039 | B2 | 6/2012 | Su et al. |
| 8,203,198 | B2 | 6/2012 | Shioga et al. |
| 8,238,116 | B2 | 8/2012 | Eggerding et al. |
| 8,267,718 | B2 | 9/2012 | Straka et al. |
| 8,293,636 | B2 | 10/2012 | Schulze et al. |
| 8,299,633 | B2 | 10/2012 | Su |
| 8,338,961 | B2 | 12/2012 | Su et al. |
| 8,339,797 | B2 | 12/2012 | Maeda et al. |
| 8,394,672 | B2 | 3/2013 | Su et al. |
| 8,446,705 | B2 | 5/2013 | Ritter et al. |
| 8,451,014 | B2 | 5/2013 | Black et al. |
| 8,456,791 | B2 | 6/2013 | Jones et al. |
| 8,472,190 | B2 | 6/2013 | Refai-Ahmed et al. |
| 8,574,965 | B2 | 11/2013 | Refai-Ahmed et al. |
| 8,624,404 | B1 | 1/2014 | Su et al. |
| 8,647,974 | B2 | 2/2014 | Topacio et al. |
| 8,691,626 | B2 | 4/2014 | Su et al. |
| 8,704,353 | B2 | 4/2014 | Su et al. |
| 8,717,774 | B2 | 5/2014 | Randall et al. |
| 8,723,314 | B2 | 5/2014 | Su et al. |
| 8,730,646 | B2 | 5/2014 | Kawasaki et al. |
| 8,759,962 | B2 | 6/2014 | Su |
| 8,796,842 | B2 | 8/2014 | Refai-Ahmed et al. |
| 8,816,474 | B2 | 8/2014 | Hanke et al. |
| 8,866,276 | B2 | 10/2014 | Su et al. |
| 8,917,491 | B2 | 12/2014 | Masuda et al. |
| 9,142,468 | B2 | 9/2015 | Bower et al. |
| 9,177,724 | B2 | 11/2015 | Abe et al. |
| 9,214,283 | B2 | 12/2015 | Togashi |
| 9,263,186 | B2 | 2/2016 | Li et al. |
| 9,330,849 | B2 | 5/2016 | Gong et al. |
| 9,343,236 | B2 | 5/2016 | Kim et al. |
| 9,385,055 | B2 | 7/2016 | Refai-Ahmed et al. |
| 9,425,121 | B2 | 8/2016 | Tsai et al. |
| 9,426,891 | B2 | 8/2016 | Tsai et al. |
| 9,437,561 | B2 | 9/2016 | Black et al. |
| 9,449,907 | B2 | 9/2016 | Fu et al. |
| 9,472,343 | B2 | 10/2016 | Ahn et al. |
| 9,478,474 | B2 | 10/2016 | Chen et al. |
| 9,524,826 | B2 | 12/2016 | Choi |
| 9,530,564 | B2 | 12/2016 | Yao |
| 9,613,755 | B2 | 4/2017 | Oh et al. |
| 9,627,281 | B2 | 4/2017 | Prejean et al. |
| 9,660,008 | B2 | 5/2017 | Bower et al. |
| 9,666,366 | B2 | 5/2017 | Ritter et al. |
| 9,787,437 | B2 | 10/2017 | Feng et al. |
| 9,793,239 | B2 | 10/2017 | Su et al. |
| 9,806,014 | B2 | 10/2017 | Alfano et al. |
| 9,837,215 | B2 | 12/2017 | Lee et al. |
| 9,837,352 | B2 | 12/2017 | Chang et al. |
| 9,847,173 | B2 | 12/2017 | Taniguchi et al. |
| 9,847,299 | B2 | 12/2017 | Teshima et al. |
| 9,960,146 | B1 | 5/2018 | Lin |
| 9,997,467 | B2 | 6/2018 | Shao et al. |
| 10,014,112 | B2 | 7/2018 | Azuma et al. |
| 10,083,795 | B2 | 9/2018 | Itamura |
| 10,109,576 | B2 | 10/2018 | Tanaka |
| 10,128,048 | B2 | 11/2018 | Park et al. |
| 10,135,416 | B2 | 11/2018 | Chong et al. |
| 10,163,735 | B2 | 12/2018 | Bower et al. |
| 10,204,737 | B2 | 2/2019 | Ritter et al. |
| 10,229,789 | B2 | 3/2019 | Park et al. |
| 10,304,628 | B2 | 5/2019 | Hwang et al. |
| 10,306,770 | B2 | 5/2019 | Hattori |
| 10,366,835 | B2 | 7/2019 | Ritter et al. |
| 10,395,837 | B2 | 8/2019 | Chong et al. |
| 10,418,180 | B2 | 9/2019 | Kageyama et al. |
| 10,418,331 | B2 | 9/2019 | Bower |
| 10,424,438 | B2 | 9/2019 | Martinex et al. |
| 10,468,363 | B2 | 11/2019 | Prevatte et al. |
| 10,490,540 | B2 | 11/2019 | Yu et al. |
| 10,522,352 | B2 | 12/2019 | Delacruz et al. |
| 10,593,618 | B2 | 3/2020 | Cheah et al. |
| 10,672,563 | B2 | 6/2020 | Cain |

(56) References Cited

U.S. PATENT DOCUMENTS

| | | |
|---|---|---|
| 10,707,145 B2 | 7/2020 | Bultitude et al. |
| 10,756,025 B2 | 8/2020 | Lee et al. |
| 10,832,912 B2 | 11/2020 | Delacruz et al. |
| 10,910,157 B2 | 2/2021 | Kim |
| 10,943,735 B2 | 3/2021 | Horn et al. |
| 10,943,869 B2 | 3/2021 | Zhai et al. |
| 10,998,261 B2 | 5/2021 | Kong et al. |
| 11,017,949 B2 | 5/2021 | Kato et al. |
| 11,121,074 B2 | 9/2021 | Cheah et al. |
| 11,139,115 B2 | 10/2021 | Cain |
| 11,239,174 B2 | 2/2022 | Lu |
| 11,276,660 B2 | 3/2022 | Lee |
| 11,289,333 B2 | 3/2022 | Delacruz et al. |
| 11,296,043 B2 | 4/2022 | Kung et al. |
| 11,302,644 B2 | 4/2022 | Lu |
| 11,302,647 B2 | 4/2022 | Chen et al. |
| 11,309,295 B2 | 4/2022 | Huang et al. |
| 11,322,428 B2 | 5/2022 | Yen et al. |
| 11,342,272 B2 | 5/2022 | Hsu et al. |
| 11,342,282 B2 | 5/2022 | Shih et al. |
| 11,348,885 B2 | 5/2022 | Kung et al. |
| 11,362,026 B2 | 6/2022 | Kuo et al. |
| 11,362,036 B2 | 6/2022 | Liu |
| 11,373,809 B2 | 6/2022 | Berolini et al. |
| 11,393,775 B2 | 7/2022 | Hsieh et al. |
| 11,404,386 B2 | 8/2022 | Cheng et al. |
| 11,437,192 B2 | 9/2022 | Kim et al. |
| 11,437,247 B2 | 9/2022 | Essig et al. |
| 11,443,997 B2 | 9/2022 | Cho et al. |
| 11,469,186 B2 | 10/2022 | Tien et al. |
| 11,469,212 B2 | 10/2022 | Black et al. |
| 11,495,531 B2 | 11/2022 | Kim et al. |
| 11,508,668 B2 | 11/2022 | Kung et al. |
| 11,538,760 B2 | 12/2022 | Lu |
| 11,538,778 B2 | 12/2022 | Fang |
| 11,545,406 B2 | 1/2023 | Yen et al. |
| 11,545,426 B2 | 1/2023 | Chou |
| 11,562,978 B2 | 1/2023 | Pon et al. |
| 11,621,217 B2 | 4/2023 | Shih et al. |
| 11,626,363 B2 | 4/2023 | Haba et al. |
| 11,636,978 B2 | 4/2023 | Cain |
| 11,637,055 B2 | 4/2023 | Tai et al. |
| 11,676,912 B2 | 6/2023 | Huang et al. |
| 11,682,656 B2 | 6/2023 | Yen et al. |
| 11,699,682 B2 | 7/2023 | Lu |
| 11,710,675 B2 | 7/2023 | Fang |
| 11,721,488 B2 | 8/2023 | Horn et al. |
| 11,721,652 B2 | 8/2023 | Lu |
| 11,721,679 B2 | 8/2023 | Jung et al. |
| 11,728,294 B2 | 8/2023 | Collins et al. |
| 11,756,896 B2 | 9/2023 | Kung et al. |
| 11,756,948 B2 | 9/2023 | Sounart et al. |
| 11,764,179 B2 | 9/2023 | Lin |
| 11,784,152 B2 | 10/2023 | Chu et al. |
| 11,823,906 B2 | 11/2023 | DeLaCruz et al. |
| 11,837,405 B2 | 12/2023 | Berolini et al. |
| 11,837,557 B2 | 12/2023 | Yang et al. |
| 11,848,160 B2 | 12/2023 | Kobayashi et al. |
| 11,848,296 B2 | 12/2023 | Yen et al. |
| 11,862,525 B2 | 1/2024 | Lin et al. |
| 11,887,967 B2 | 1/2024 | Wu et al. |
| 11,997,888 B2 | 5/2024 | Chen et al. |
| 12,027,467 B2 | 7/2024 | Cho et al. |
| 12,033,982 B2 | 7/2024 | Zhai |
| 12,074,118 B2 | 8/2024 | Huang et al. |
| 12,100,697 B2 | 9/2024 | Lin et al. |
| 12,148,679 B2 | 11/2024 | Pi |
| 12,170,241 B2 | 12/2024 | Kuo et al. |
| 12,176,297 B2 | 12/2024 | Hsieh et al. |
| 12,506,116 B2 | 12/2025 | Lin et al. |
| 2002/0074653 A1* | 6/2002 | Khandros .............. H01L 23/50 |
| | | 257/E23.079 |
| 2004/0027787 A1* | 2/2004 | Yamauchi ............. H01G 4/012 |
| | | 361/321.2 |
| 2004/0125580 A1 | 7/2004 | Chung et al. |
| 2007/0035014 A1 | 2/2007 | Fung |
| 2007/0096254 A1 | 5/2007 | Ritter et al. |
| 2008/0130198 A1* | 6/2008 | Nakano .................. H01G 4/012 |
| | | 361/303 |
| 2008/0186650 A1 | 8/2008 | Beker |
| 2009/0244807 A1 | 10/2009 | Lee et al. |
| 2010/0039749 A1* | 2/2010 | Ritter .................... H01G 4/005 |
| | | 29/25.42 |
| 2010/0188799 A1 | 7/2010 | Galvagni et al. |
| 2012/0073129 A1* | 3/2012 | Abe ........................ H01G 4/30 |
| | | 29/825 |
| 2013/0002388 A1* | 1/2013 | Kim ........................ H01G 4/30 |
| | | 336/200 |
| 2013/0094157 A1 | 4/2013 | Guiliano |
| 2013/0201615 A1 | 8/2013 | Arnold et al. |
| 2013/0256913 A1 | 10/2013 | Black et al. |
| 2014/0293501 A1* | 10/2014 | Jeong .................... H01G 4/012 |
| | | 361/301.4 |
| 2015/0014037 A1 | 1/2015 | Ahn et al. |
| 2015/0016016 A1 | 1/2015 | Lee et al. |
| 2015/0243438 A1 | 8/2015 | Ahn et al. |
| 2015/0294791 A1 | 10/2015 | Hwang et al. |
| 2016/0093437 A1* | 3/2016 | Itamura .................. H01G 4/012 |
| | | 361/301.4 |
| 2016/0126013 A1 | 5/2016 | Park et al. |
| 2016/0240317 A1* | 8/2016 | Ro ........................... H01G 4/30 |
| 2017/0012029 A1 | 1/2017 | Lambert et al. |
| 2018/0158772 A1 | 6/2018 | Tanaka |
| 2018/0330880 A1 | 11/2018 | Cain |
| 2019/0080982 A1 | 3/2019 | Bultitude et al. |
| 2020/0075571 A1 | 3/2020 | Chen et al. |
| 2022/0157709 A1 | 5/2022 | Shih et al. |
| 2023/0019800 A1 | 1/2023 | Cain |
| 2024/0145169 A1 | 5/2024 | Berolini |
| 2024/0145172 A1 | 5/2024 | Berolini |
| 2024/0145449 A1 | 5/2024 | Desclos |
| 2024/0145451 A1 | 5/2024 | Desclos |
| 2024/0145452 A1 | 5/2024 | Desclos |
| 2024/0145528 A1 | 5/2024 | Desclos |
| 2024/0145529 A1 | 5/2024 | Desclos |
| 2024/0265305 A1 | 8/2024 | DeLaCruz et al. |
| 2024/0363505 A1 | 10/2024 | Kuo et al. |
| 2024/0429157 A1 | 12/2024 | Desclos |
| 2024/0429182 A1 | 12/2024 | Desclos |

FOREIGN PATENT DOCUMENTS

| | | |
|---|---|---|
| JP | 2004304159 A | 10/2004 |
| JP | 2005039005 A | 2/2005 |
| JP | 2005150283 A | 6/2005 |
| JP | 2008022017 | 1/2008 |
| JP | 2008085054 A | 4/2008 |
| JP | 2009081183 A | 4/2009 |
| JP | 2010183025 A | 8/2010 |
| JP | 2010199269 A | 9/2010 |
| JP | 2018520507 A | 7/2018 |
| KR | 20050089493 A | 9/2005 |
| KR | 20070081537 A | 8/2007 |
| KR | 101539884 | 7/2015 |
| KR | 102387826 B1 | 4/2022 |
| KR | 102393946 B1 | 5/2022 |
| WO | WO 2024/097034 | 5/2024 |

OTHER PUBLICATIONS

AVX, Low Inductance Capacitors, p. 1-12, http://www.avxcorp.com.

Brown, Land Grid Array (LGA) Low Inductance Capacitor Advantages in Military and Aerospace Applications, 5 pages.

Cantlebary, AVX Corporation, Technical Information, LICA (Low Inductance Capacitor Array Flip-Chip Application Notes, 14 pages.

Kyocera AVX, Low Inductance Capacitors, Surface Mount Ceramic Capacitor Products, p. 75-78.

Lau, "Chiplet Heterogeneous Integration" Semiconductor Advanced Packaging, 2021, pp. 413-439.

(56)          References Cited

OTHER PUBLICATIONS

International Search Report and Written Opinion for PCT/US2023/035669 dated Feb. 8, 2024, 12 pages.

* cited by examiner

202

550d

204

550c

202

550b

204

550a $t_3$ $t_2$ $t_1$

204

202

204

202

50

MULTILAYER CAPACITOR

RELATED APPLICATION

The present application is based upon and claims priority to U.S. Provisional Patent Application Ser. No. 63/420,726, having a filing date of Oct. 31, 2022, which is incorporated herein by reference.

BACKGROUND OF THE SUBJECT MATTER

Multilayer capacitors are generally constructed having a plurality of dielectric layers and internal electrode layers arranged in a stack. During manufacture, the stacked dielectric layers and internal electrode layers are pressed and sintered to achieve a substantially unitary capacitor body. In an attempt to improve upon the performance of these capacitors, various configurations and designs have been employed for the dielectric layers and the internal electrode layers.

However, as rapid changes occur in the electronics industry requiring new performance criteria, these configurations are commonly manipulated. In particular, various application design considerations have created a need to redefine the capacitor parameters and its performance in high-speed environments, especially in light of faster and denser integrated circuits. For instance, larger currents, denser circuit boards, and spiraling costs have all served to focus upon the need for better and more efficient capacitors. Additionally, the design of various electronic components has been driven by a general industry trend toward miniaturization, as well as increased functionality.

In such regard, a need exists for providing a capacitor with improved operational characteristics.

SUMMARY OF THE SUBJECT MATTER

In accordance with one embodiment of the present invention, a multilayer capacitor is disclosed. The multilayer capacitor has a first end and a second end that is spaced apart from the first end in a longitudinal direction that is perpendicular to a lateral direction, the lateral direction and longitudinal direction each being perpendicular to a Z-direction. The multilayer capacitor includes a body having a top surface and a bottom surface opposing the top surface along the Z-direction. The body contains alternating dielectric layers and electrode layers, the electrode layers including first electrode layers and second electrode layers. Each electrode layer includes a first electrode having a base section, a connecting section, and a central section; a first connecting edge of the connecting section extending from a first leading edge of the base section to a first edge of the central section; and a second connecting edge of the connecting section extending from a second leading edge of the base section to a second edge of the central section. The multilayer capacitor also includes a plurality of external terminations including a first external termination disposed on at least one of the top surface or the bottom surface and a second external termination disposed on at least one of the top surface or the bottom surface. The first external termination is electrically connected to the first electrode layers along at least one of the first leading edge or the second leading edge of the first electrode of the first electrode layers. The second external termination is electrically connected to the second electrode layers along at least one of the first leading edge or the second leading edge of the first electrode of the second electrode layers. At least a portion of at least one of the first connecting edge or the second connecting edge of the first electrode of the electrode layers is not perpendicular to the respective first edge or second edge of the central section of the first electrode.

Other features and aspects of the present invention are set forth in greater detail below.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

DETAILED DESCRIPTION OF THE SUBJECT MATTER

Figure 1A:
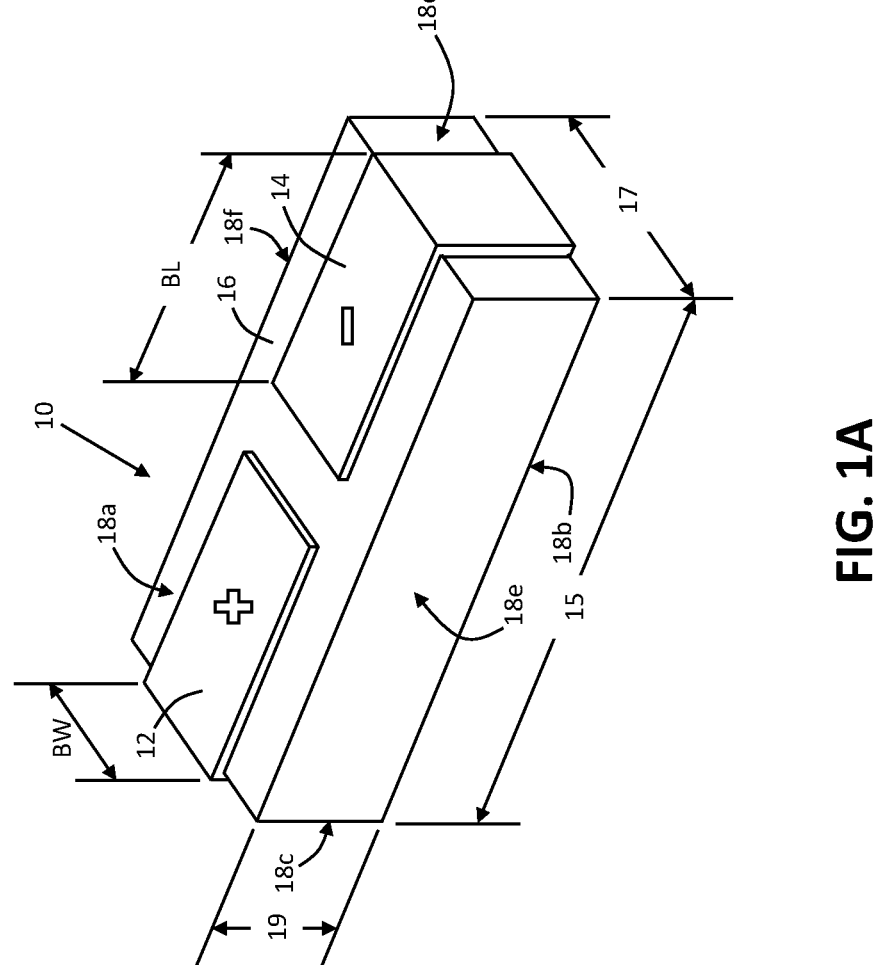
FIG. 1A illustrates a generally top and sides external perspective view of one embodiment of a capacitor including two external terminations in accordance with the present invention.
Figure 1A:
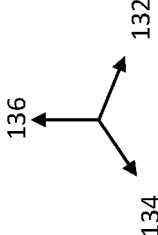

It is to be understood by one of ordinary skill in the art that the present discussion is a description of exemplary embodiments only and is not intended as limiting the broader aspects of the present invention.

Generally speaking, the present invention is directed to a multilayer capacitor. The multilayer capacitor (or simply, capacitor) contains at least one set of alternating dielectric layers and electrode layers within a single body, as well as a plurality of external terminations. Further, the electrode layers may include an electrode having a certain configuration. More particularly, at least one electrode layer includes an electrode comprising at least one edge that is not perpendicular to an intersecting edge. That is, aspects of the present disclosure relate to controlling the shape of the electrodes to improve operational characteristics of the capacitor, such as, e.g., an increased breakdown voltage.

As used herein, a first edge described as "not perpendicular" to a second edge generally indicates that the first and second edges meet or intersect in a way that the intersecting edges do not form a generally right or 90 degree angle. The intersection of such edges also may be referred to as non-orthogonal. Moreover, one of the two edges may be referred to as a non-normal edge. Additionally, or alternatively, the electrode having such a first edge that is not perpendicular to a second, intersecting edge may be described in terms of the overall shape of the electrode, which will be understood to include the non-perpendicular intersecting edges.

Various examples of electrodes including at least a portion of at least one edge that is not perpendicular to an intersecting edge are described and illustrated herein. For instance, the electrode may have a connecting section and a central section as defined herein wherein an angle of from greater than 90° to less than 180° is formed between an edge of the central section and a connecting edge of the connecting section. Without intending to be limited by theory, such an angle may provide the electrode with a generally Y-shaped configuration.

As another example, the electrode may include at least one curved or rounded connecting edge. The curved or rounded connecting edge may define a rounded corner. Rounded corners can provide an increased breakdown voltage by reducing electric field/charge concentrations. For example, rectangular electrodes generally concentrate electric field and charge concentrations at their corners, such that breakdown of the dielectric is more likely to occur near the corners of the dielectric. According to aspects of the present disclosure, the at least a portion of at least one edge that is not perpendicular to an intersecting edge may be curved or rounded, which may reduce electric field concentrations in the dielectric material. For example, although the electrodes' corners and the corners of the charged portion of the dielectric generally do not coincide, they may still be relatively close to each other. As a result, reducing charge concentration in the corners of the electrodes further reduces charge concentration in the charged portion of the dielectric. Reducing the charge concentration in turn increases the breakdown voltage compared with an otherwise similar capacitor employing conventional electrodes.

Additionally, in some embodiments, a perimeter of the electrode may be free of geometric discontinuities. As an example, rounded corners may continuously blend into adjacent straight edges of the electrode without geometric discontinuity. Geometric discontinuities are generally described with reference to corresponding orders of derivation. For example, shapes may generally be defined by a coordinate function (e.g., Cartesian or polar coordinates). A shape is geometrically continuous if there are no discontinuities in the coordinate function itself. Similarly, a shape is geometrically continuous to a first order if there are no discontinuities in both the coordinate function and its first order derivative. An electrode having a perimeter that is geometrically continuous to at least a first order may further reduce electric field and charge concentrations in the corners and/or along the edges of the electrodes adjacent the corners. This reduction may increase the breakdown voltage of the capacitor compared with conventional electrode designs.

Further, the present inventors have discovered that by utilizing such configurations for the capacitor and electrode layers therein as well as by utilizing specific materials for the electrodes and dielectrics as described herein, the multilayer capacitor may have a low equivalent series resistance, in particular across a broad range of frequencies. In particular, such low equivalent series resistance may be realized and beneficial at relatively high frequencies.

In this regard, the capacitor may have an equivalent series resistance of 100 Ohms or less, such as 75 Ohms or less, such as 50 Ohms or less, such as 40 Ohms or less, such as 30 Ohms or less, such as 25 Ohms or less, such as 20 Ohms or less, such as 15 Ohms or less, such as 10 Ohms or less, such as 8 Ohms or less, such as 5 Ohms or less, such as 3 Ohms or less, such as 2 Ohms or less, such as 1 Ohm or less. The equivalent series resistance may be 0.01 Ohms or more, such as 0.1 Ohms or more, such as 0.2 Ohms or more, such as 0.3 Ohms or more, such as 0.5 Ohms or more, such as 0.8 Ohms or more, such as 1 Ohm or more, such as 2 Ohms or more, such as 3 Ohms or more, such as 5 Ohms or more, such as 8 Ohms or more, such as 10 Ohms or more. Such equivalent series resistance may be realized when measured across a frequency range of from 1 GHz to 10 GHz, such as from 2 GHz to 10 GHz, such as from 3 GHz to 10 GHz, such as from 4 GHz to 9 GHz. The equivalent series resistance may be measured using general techniques as known in the art and as described herein.

In some embodiments the capacitor may exhibit the aforementioned equivalent series resistance at about a single frequency. For instance, in one embodiment, the capacitor may exhibit the aforementioned equivalent series resistance at about 2 GHz, such as at about 3 GHz, such as at about 4 GHz, such as at about 5 GHz, such as at about 6 GHz, such as at about 7 GHz, such as at about 8 GHz, such as at about 9 GHz, such as at about 10 GHz. In one embodiment, the capacitor may exhibit the aforementioned equivalent series resistance at more than one of the aforementioned frequencies.

Figures 6, 7:
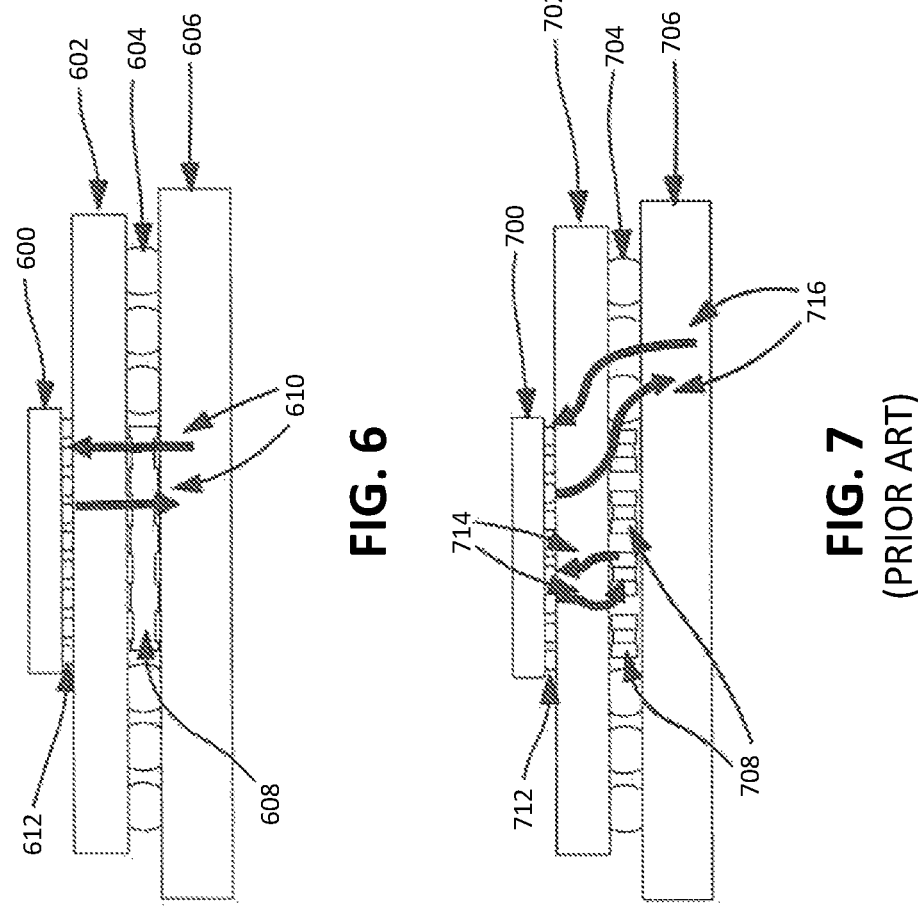
FIG. 6 illustrates a side view of a printed circuit board and integrated circuit package containing a packaged capacitor in accordance with the present invention.
FIG. 7 illustrates a side view of a printed circuit board and integrated circuit package containing a plurality of multilayer ceramic capacitors of the prior art.

In addition to exhibiting a relatively low equivalent series resistance due to the selective control over the particular configuration of the electrodes and capacitor as well as the materials for the electrodes and dielectrics, the resulting capacitor may also exhibit a low equivalent series inductance. In certain applications, it is desirable to maintain as low an inductance (i.e., parasitic inductance) as possible. Employing the capacitor of the present invention allows for a substantial reduction in inductance. In particular, minimizing the distance or path for a ground connection can assist in reducing the inductance. In general, employing a capacitor of the present invention as illustrated in FIG. 6 can allow for at least one order of magnitude reduction in inductance in comparison to employing a plurality of individual multilayer ceramic capacitors as illustrated in FIG. 7. For instance, employing the capacitor of the present invention may result in an inductance on the order of picohenries or even femtohenries in comparison to capacitors of the prior art which exhibit inductance of greater magnitudes. In general, the inductance may be less than 1 nanohenry. In particular, the inductance may be 900 picohenries or less, such as 750 picohenries or less, such as 500 picohenries or less, such as 400 picohenries or less, such as 250 picohenries or less, such as 100 picohenries or less, such as 50 picohenries or less, such as 25 picohenries or less, such as 15 picohenries or less, such as 10 picohenries or less. The inductance may be 1 femtohenry or more, such as 25 femtohenries or more, such as 50 femtohenries or more, such as 100 femtohenries or more, such as 250 femtohenries or more, such as 500 femtohenries or more, such as 750 femtohenries or more. Minimizing such inductance can contribute to good performance, in particular good decoupling performance, especially under high-speed transient conditions. The low equivalent series inductance values may also be characterized by a low impedance value, which is a reflection of parasitic inductance.

The electrode layers within a set may be stacked in a lateral direction such that they would be perpendicular to a mounting surface. In this regard, each electrode layer would extend in a longitudinal direction and a Z-direction, both perpendicular to the lateral direction. By arranging the dielectric layers and the electrode layers in a stacked or laminated configuration, the capacitor may be referred to as a multilayer capacitor and in particular a multilayer ceramic capacitor, for instance when the dielectric layers comprise a ceramic.

Further, in some embodiments, multiple sets of alternating dielectric layers and electrode layers may be included within a single capacitor body. For example, a multilayer capacitor may contain a first set of alternating dielectric layers and electrode layers and a second set of alternating dielectric layers and electrode layers. The capacitor may also include external terminations electrically connected to the electrode layers wherein the external terminations are formed on a top surface of the capacitor and a bottom surface of the capacitor opposing the top surface of the capacitor. In other embodiments, the capacitor may include at least three, such as at least four sets of alternating dielectric layers and electrode layers. However, it should be understood that the present invention may include any number of sets of alternating dielectric layers and electrode layers and is not necessarily limited. In addition, the sets of alternating dielectric layers and electrode layers may be separated from an adjacent set by a certain distance. For instance, that distance is greater than the thickness of an individual dielectric layer in the set. In particular, the distance may be at least two, such as at least 3, such as at least 5, such as at least 10 times the thickness of a dielectric layer in the set.

In general, the thickness of the dielectric layers and internal electrode layers is not limited and can be any thickness as desired depending on the performance characteristics. For instance, the thickness of the electrode layers can be, but is not limited to, being about 500 nm or greater, such as about 1 μm or greater, such as about 1.5 μm or greater, such as about 2 μm or greater, such as about 3 μm or greater, such as about 4 μm or greater. The thickness of the electrode layers may be about 10 μm or less, such as about 5 μm or less, such as about 4 μm or less, such as about 3 μm or less, such as about 2.5 μm or less, such as about 2 μm or less. For instance, the internal electrode layers may have a thickness of from about 1 μm to about 2 μm.

In addition, the present invention is not necessarily limited by the number of internal electrode layers per set of alternating dielectric layers and internal electrode layers or in the entire capacitor. For instance, each set may include 10 or more, such as 25 or more, such as 50 or more, such as 100 or more, such as 200 or more, such as 300 or more, such as 500 or more, such as 600 or more, such as 750 or more, such as 1,000 or more internal electrode layers. Each set may have 5,000 or less, such as 4,000 or less, such as 3,000 or less, such as 2,000 or less, such as 1,500 or less, such as 1,000 or less, such as 750 or less, such as 500 or less, such as 400 or less, such as 300 or less, such as 250 or less, such as 200 or less, such as 175 or less, such as 150 or less internal electrode layers. Also, the entire capacitor may include the aforementioned number of electrode layers.

In addition to alternating internal electrode layers and dielectric layers, the capacitor also includes a first external terminal that is electrically connected to first internal electrode layers and disposed on a first surface of the capacitor (e.g., upper surface) and a second external terminal that is electrically connected to the first internal electrode layers and disposed on a second surface of the capacitor (e.g., lower surface). Likewise, a third external terminal is electrically connected to second internal electrode layers and disposed on the first surface of the capacitor and a fourth external terminal is electrically connected to the second internal electrode layers and disposed on the second surface of the capacitor. Typically, the first and second external terminals have the same polarity (e.g., positive) and the third and fourth external terminals have the same polarity (e.g., negative).

The capacitor may also include external terminals on opposing end surfaces. For instance, one or more of the external terminals may extend from the first surface (e.g., upper surface) and/or second surface (e.g., lower surface) to an end surface. When present on the end surface, the external terminal may only be present partially on the end surface such that it does not cover the entire end surface. In another embodiment, the capacitor may not include any external terminals on opposing end surfaces. In one particular embodiment, the external terminals may not be present on a side surface of the capacitor. Regardless, the external terminals generally include at least one first polarity terminal and at least one second and opposite polarity terminal. The capacitor may include at least one, such as at least two, such as at least four, such as at least six, such as at least eight first polarity terminals and/or second and opposite polarity terminals on an upper surface of the capacitor. Additionally, the capacitor may include the aforementioned amounts of terminals on a lower surface of the capacitor.

The capacitor may include an equal number of first polarity terminals and/or second polarity terminals on the upper and lower surfaces of the capacitor. The number of first polarity terminals may equal the number of second and opposite polarity terminals on an upper surface of a capacitor. The number of first polarity terminals may equal the number of second and opposite polarity terminals on a lower surface of a capacitor. The total number of terminals present on an upper surface of the capacitor may equal to the total number of terminals present on a lower surface of the capacitor. The total number of first polarity terminals present on an upper surface and a lower surface of the capacitor may equal the total number of second and opposite polarity terminals present on an upper surface and a lower surface of the capacitor. Typically, the like polarity terminals on the lower surface of the capacitor that correspond to a particular set of alternating dielectric layers and internal electrode layers are electrically connected to the like polarity terminals on the upper surface of the capacitor. The like polarity terminals located on an upper surface and a lower surface of a capacitor may not be interdigitated. In this regard, corresponding like polarity terminals on a top and a lower surface may not be offset by a terminal position but may instead be positioned directly above or below another like polarity terminal on the opposite top or lower surface. In other words, corresponding like polarity terminals that correspond to a particular set of alternating dielectric layers and internal electrode layers, and in particular corresponding lead tabs of such set, may be substantially aligned. By substantially aligned, it is meant that the offset from a side edge of one lateral edge of a polarity terminal on an upper surface is within +/−10%, such as within +/−5%, such as within +/−4%, such as within +/−3%, such as within +/−2%, such as within +/−1%, such as within +/−0.5% of the offset from a side edge of a corresponding polarity terminal on a lower surface.

The particular arrangement of the elements of the capacitor (such as, e.g., the orientation of the electrode layers, the number of sets of alternating layers in a single capacitor body) can provide several advantages. For instance, the capacitor of the present invention may be mounted onto a circuit board as a surface mount capacitor and may provide a smaller footprint on the circuit board. This may in turn also allow for a reduction in size of a circuit board.

The capacitor of the present invention can be further described according to the embodiments as illustrated in FIGS. 1A-1G, 2A-2C, 3A-3C, 4A-4B, 5A-5B, and 6.

Turning to FIGS. 1A-1G, one embodiment of a multilayer capacitor 10 is disclosed. In general, the capacitor 10 includes a body 16 containing a plurality of alternating dielectric layers and electrode layers 102, 104. A first external termination 12 and a second external termination 14 are formed on the capacitor body 16.

For example, the capacitor 10 has a 1 by 2 configuration. That is, the capacitor 10 includes two external terminals arranged in a linear fashion in a single dimension on a top surface and a bottom surface of the capacitor. In the depicted embodiment, the capacitor 10 includes external terminals arranged in a linear fashion or a single row along a longitudinal direction L, which may be referred to as a linear terminal arrangement. Further, in the depicted embodiment, the external terminations 12, 14 are spaced apart from side surfaces 18e, 18f of the capacitor body 16 such that only dielectric material is disposed between the external terminations 12, 14 and the side surfaces 18e, 18f.

The body 16 includes six surfaces. For instance, referring to FIG. 1A, the body 16 includes a top surface 18a and an opposing bottom surface 18b in the Z-direction 136 or width direction. The body 16 may also include two end surfaces 18c, 18d extending between the top surface 18a and the bottom surface 18b. The end surfaces 18c, 18d may be opposed to each other in a longitudinal direction 132 or length direction. The end surfaces 18c, 18d may extend in a lateral direction 134 and the Z-direction 136. The body 16 may also include two side surfaces 18e, 18f also extending between the top surface 18a and the bottom surface 18b. The side surfaces 18e, 18f may extend in the longitudinal direction 132 and the Z-direction 136. In one embodiment, the side surfaces 18e, 18f may be parallel with the major face of the electrodes. Similarly, in one embodiment, the top and bottom surfaces 18a, 18b may be perpendicular with the major face of the electrodes. Accordingly, in one embodiment, the body 16 includes at least six total surfaces (e.g., one top, one bottom, two sides, and two ends). In this regard, the body 16 may have a parallelepiped shape, such as a rectangular parallelepiped shape.

Figure 1B:
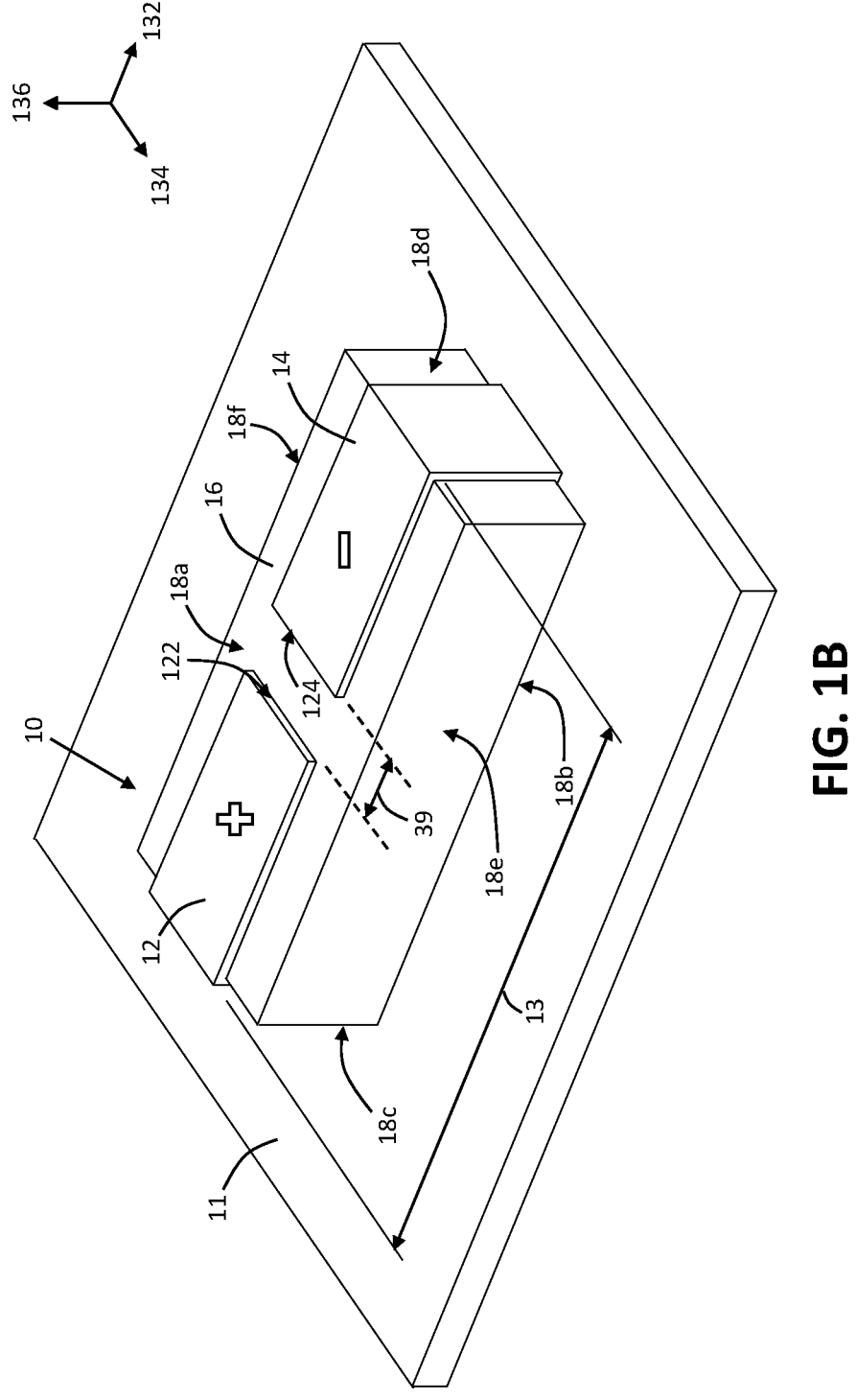
FIG. 1B illustrates a perspective view of the capacitor of FIG. 1A mounted on a mounting surface in accordance with the present invention.

Further, as illustrated in FIG. 1B, the capacitor 10 may be mounted to a mounting surface 11, such as a printed circuit board or substrate. In this regard, the multilayer capacitor may be configured for mounting to a mounting surface such that the electrode layers are perpendicular to the mounting surface.

The multilayer capacitor 10 may include a plurality of electrode layers 102, 104 and dielectric layers stacked in the lateral direction 134. Some dielectric layers may include electrode layers formed thereon. In general, the thickness of the dielectric layers and the electrode layers is not limited and can be any thickness as desired depending on the performance characteristics of the capacitor. For instance, the electrode layers may have a thickness of from about 1 μm to about 2 μm, although electrode layers having other thicknesses as described herein may be used as well. In addition, in one embodiment, the thickness of the dielectric layers may be defined according to the aforementioned thickness of the electrode layers. Also, it should be understood that such thicknesses of the dielectric layers may also apply to the layers between any electrode layers.

Figure 1C:
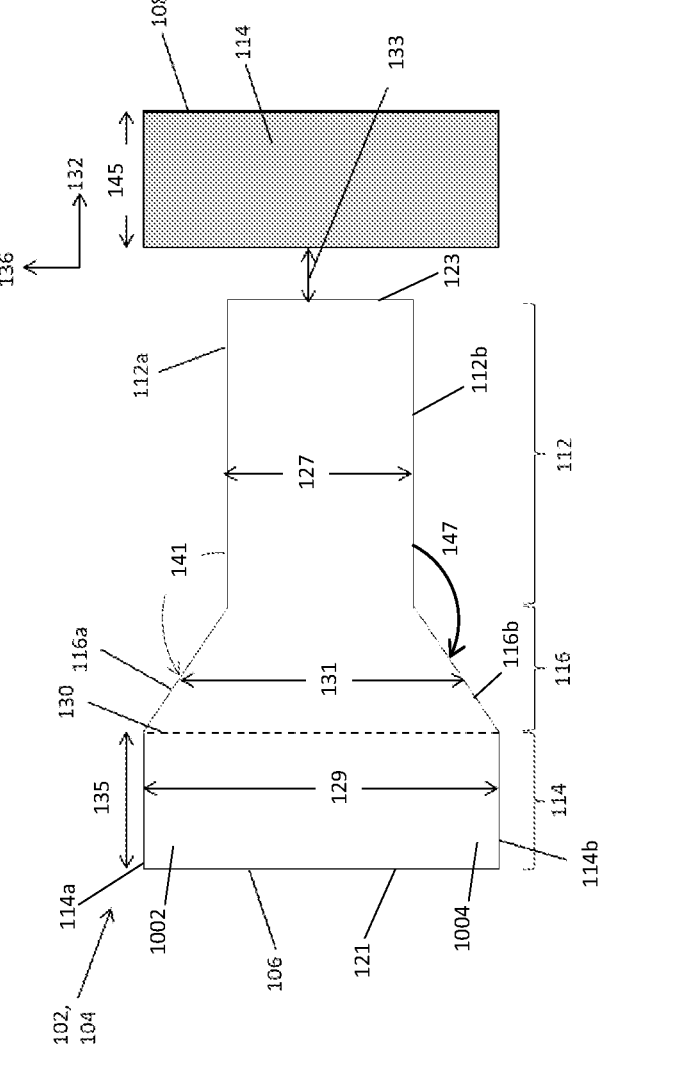
FIG. 1C illustrates a side perspective view of an electrode layer of the capacitor of FIG. 1A in accordance with an embodiment of the present invention.

FIG. 1C illustrates a side view of one embodiment of an electrode configuration according to aspects of the present disclosure. More specifically, the electrode layers may include first electrode layers 102 and second electrode layers 104 in an alternating arrangement, for example as described below with reference to FIG. 1E. Referring to FIG. 1C, each electrode layer 102, 104 may include a first electrode 106 and a second electrode 108. The first electrode 106 may have a base section 114. For instance, the base section 114 of the first electrode 106 may extend in a longitudinal direction 132 and have a vertical edge 121 that extends in a Z-direction 136. The base section 114 may also include a first leading edge 114a and a second leading edge 114b opposite the first leading edge 114a along the Z-direction 136. The first and second leading edges 114a, 114b each extend in the longitudinal direction 132 and intersect the vertical edge 121 such that the edges 114a, 114b, 121 define the boundaries of the first electrode 106 in the base section 114.

The second electrode 108 may have a base section 114. For instance, the base section 114 of the second electrode 108 may also extend in a longitudinal direction 132 and have a lateral edge that extends in a Z-direction 136.

The first electrode 106 may also have a central section 112. The central section 112 may extend in the longitudinal direction 132 and have a vertical edge 123 that extends in the Z-direction 136. The vertical edge 123 of the central section 112 is opposite the vertical edge 121 of the base section 114 such that the vertical edges 121, 123 define the longitudinal boundaries of the first electrode 106. Further, the central section 112 may include a first edge 112a and a second edge 112b opposite the first edge 112a along the Z-direction 136. The first and second edges 112a, 112b each extend in the longitudinal direction 132 and intersect the vertical edge 123 such that the edges 112a, 112b, 123 define the boundaries of the first electrode 106 in the central section 112.

The central section 112 of the first electrode 106 may have a first width 127 extending, for example, in the Z-direction 136. In addition, the base section 114 of the first electrode 106 may have a second width 129, extending, for example, in the Z-direction 136. In this regard, the location of the first width 127 may be offset from the location of the second width 129 in the longitudinal direction 132 such that the location of the second width 129 is closer to the external termination to which it is electrically connected. Such a configuration may allow for adjustment of an overlapping area between central sections 112 of adjacent electrodes in the lateral direction 134. Further, in at least some embodiments, the second width 129 of the base section 114 may be greater than the first width 127 of the central section 112.

In addition, a central end gap distance 133 may be formed in the longitudinal direction 132 between a longitudinal end of the central section 112 of the first electrode 106 and a longitudinal end of the base section 114 of the second electrode 108. Accordingly, in one embodiment, a ratio of the central end gap distance 133 to a capacitor length 15 (FIG. 1A) may be 0.01 or more, such as 0.05 or more, such as 0.1 or more, such as 0.2 or more, such as 0.3 or more, such as 0.4 or more. The ratio may be such as 0.5 or less, such as 0.4 or less, such as 0.3 or less, such as 0.2 or less, such as 0.1 or less.

In general, the internal electrode layers 102, 104 include at least one lead tab 1002, 1004 extending along the Z-direction 136 from a top edge and a bottom edge of the central section 112 of the internal electrode layers. For instance, as shown in FIG. 1C, a first lead tab 1002 extends from a top edge 112a of the central section 112, and a second lead tab 1004 extends from a bottom edge 112b. Generally, the lead tabs 1002, 1004 of the electrode layers 102, 104 extend to the top surface and the bottom surface of the capacitor and assist in forming the external terminals 12, 14. In this regard, the lead tabs 1002, 1004 may be exposed on the top surface 18a and the bottom surface 18b of the capacitor and allow for connection between the central section 112 of the internal electrode layers and the external terminals 12, 14. For instance, lead tabs 1002, 1004 may be defined by the base section 114 and include first and second leading edges 114a, 114b that extend to an edge of a dielectric layer and allow for formation of the external terminations 12, 14 on the top surface 18a and bottom surface 18b.

The length of the lead tabs 1002, 1004 may vary as desired, but is typically from about 0.3 to about 1.2 mm, in some embodiments from about 0.4 to about 1.1 mm, and in some embodiments, from about 0.5 to about 1 mm. When more than one lead tab is present along an edge, each lead tab may have the same length. In another embodiment, each lead tab may have a different length. For instance, the lead tab substantially aligned with the side edge of the internal electrode layer may have a length greater than the lead tab offset from the side edges of the internal electrode layer. In this regard, the ratio of the length of the lead tab aligned with the side edge of the internal electrode layer to the length of the lead tab offset from the side edges of the internal electrode layer may from about 0.3 to about 5, in some embodiments from about 0.5 to about 4, and in some embodiments, from about 0.7 to about 3. By being substantially aligned, it is generally meant that the offset from a side edge of one lateral edge of a first lead tab and/or second lead tab on a top edge is within +/−10%, such as within +/−5%, such as within +/−4%, such as within +/−3%, such as within +/−2%, such as within +/−1%, such as within +/−0.5% of the offset from a side edge of a corresponding lateral edge of a first lead tab and/or second lead tab on a bottom edge.

The lead tabs 1002, 1004 on the top edge and the bottom edge of internal electrode layers 102, 104 may be aligned in the vertical direction. That is, a lateral edge of a first lead tab 1002 (extending along the Z-direction 136) may be aligned with a lateral edge of a second lead tab 1004 (extending along the Z-direction 136) opposite the first lead tab 1002. In addition, such lateral edges of the lead tabs 1002, 1004 may be aligned with a side edge 121 of the internal electrode layer 102, 104. However, it should be understood that the lateral edges of the lead tabs 1002, 1004 may be aligned with one another but offset from the side edge 121.

As described, the relationship between lateral edges of a first lead tab on a top edge and a second lead tab on a bottom edge as mentioned with respect to internal electrode layer 102 may also apply to internal electrode layer 104. With such arrangement, a gap may be formed between a first lead tab 1002 of the first internal electrode layer 102 and a first lead tab 1002 of the second internal electrode layer 104. Similarly, a gap may be formed between a second lead tab 1004 of the first internal electrode layer 102 and a second lead tab 1004 of the second internal electrode layer 104. The size of each respective gap may be substantially the same.

The lead tabs 1002 may be arranged in parallel with lead tabs 1004 extending from the internal electrode layers 102 and 104 such that the lead tabs extending from alternating electrode layers 102 and 104 may be aligned in a respective column. For instance, lead tabs 1002, 1004 of internal electrode layers 102 may be arranged in a respective stacked configuration while lead tabs 1002, 1004 of internal electrode layers 104 may be arranged in a respective stacked configuration.

It will be appreciated that lead tabs 1002, 1004 of electrode layers 102 connect to external termination 12 while lead tabs 1002, 1004 of electrode layers 104 connect to external termination 14. Accordingly, respective lead tabs 1002, 1004 of electrode layers 102 will be interdigitated with respective lead tabs 1002, 1004 of electrode layers 104 in a manner similar to external terminations 12 and 14. The interdigitated lead tabs can provide multiple, adjacent current injection points onto the associated main electrode portions.

The distance between adjacent exposed lead tabs of the internal electrode layers in a given column may be specifically designed to help ensure guided formation of terminations. The distance between exposed lead tabs of the internal electrode layers in a given column may, for example, range from about 0.25 to about 10 μm, in some embodiments from about 0.5 to about 5 μm, and in some embodiments, from about 1 to about 4 μm. Additionally, the distance between adjacent columnar stacks of electrode tabs may be, while not limited, greater by at least a factor of two than the distance between adjacent lead tabs in a given column to ensure that distinct terminations do not run together. In some embodiments, the distance between adjacent columnar stacks of exposed metallization may be about four times (4×) the distance between adjacent exposed electrode tabs in a particular stack. However, such distance may vary depending on the desired capacitance performance and circuit board configuration. For example, the distance may be from about 0.1 to about 1.5 mm, in some embodiments from about 0.2 to about 1.3 mm, and in some embodiments, from about 0.3 to about 1 mm, as determined based on the center-point of each lead tab or based on the distance between adjacent lateral edges of the lead tabs. In addition, such distance may correspond to the separation distance of the ball on a ball grid array.

Referring still to FIG. 1C, the first electrode 106 may also have a connecting section 116. The connecting section 116 may extend from the base section 114 in the longitudinal direction 132. In particular, the connecting section 116 may extend between and connect the base section 114 and the central section 112. For example, a first connecting edge 116a of the connecting section 116 extends from the first leading edge 114a of the base section 114 to the first edge 112a of the central section 112, and a second connecting edge 116b of the connecting section 116 extends from the second leading edge 114b of the base section 114 to the second edge 112b of the central section 112. Thus, the first connecting edge 116a intersects the first leading edge 114a and the first edge 112a to connect the base section 114 to the central section 112 along one longitudinal side of the first electrode 106, and the second connecting edge 116b intersects the second leading edge 114b and the second edge 112b to connect the base section 114 to the central section 112 along the other, opposite longitudinal side of the first electrode 106.

The connecting section 116 may have a third width 131 extending, for example, in the Z-direction 136. In this regard, the location of the third width 131 may be offset from the location of the first width 127 and the location of the second width 129 in the longitudinal direction 132. In one embodiment, the third width 131 of the connecting section may be less than the second width 129 of the base section 114. Also, the third width 131 of the connecting section may be greater than the first width 127 of the central section 112. In this regard, the location of the third width 131 may be between the location of the first width 127 and the location of the second width 129.

Moreover, the third width 131 may vary within the connecting section 116. For example, the third width 131 may have a first value at one location within the connecting section 116 and a second, different value at another location within the connecting section 116, where the two locations within the connecting section 116 are spaced apart from one another along the longitudinal direction 132.

At least a portion of at least one of the first connecting edge 116a or the second connecting edge 116b is not perpendicular to the edge 112a, 112b of the central section the connecting edge 116a, 116b intersects. For instance, in one embodiment, the first connecting edge 116a of the connecting section 116 may form a first angle 141 with the first edge 112a of the central section 112. Such angle 141 may be greater than 90° and less than 180°. For instance, such angle 141 may be greater than 90°, such as 95° or more, such as 100° or more, such as 110° or more, such as 120° or more, such as 130° or more, such as 140° or more. Such angle 141 may be less than 180°, such as 175° or less, such as 170° or less, such as 160° or less, such as 150° or less, such as 140° or less, such as 130° or less, such as 120° or less, such as 110° or less. Without intending to be limited by theory, such configuration may provide for a generally Y-shaped electrode configuration.

Further, in the depicted embodiment of FIG. 1C, a second angle 147 is formed between the second edge 112b of the central section 112 and the second connecting edge 116b of the connecting section 116, with the second angle 147 being greater than 90° and less than 180° as described above with respect to the first angle 141. Accordingly, for the first electrode 106 shown in FIG. 10, at least a portion of the first connecting edge 116a is not perpendicular to the first edge 112a and at least a portion of the second connecting edge 116b is not perpendicular to the second edge 112b. It will also be appreciated that, for the depicted embodiment, at least a portion of the first connecting edge 116a is not perpendicular to the first leading edge 114a and at least a portion of the second connecting edge 116b is not perpendicular to the second leading edge 114b.

Figure 1D:
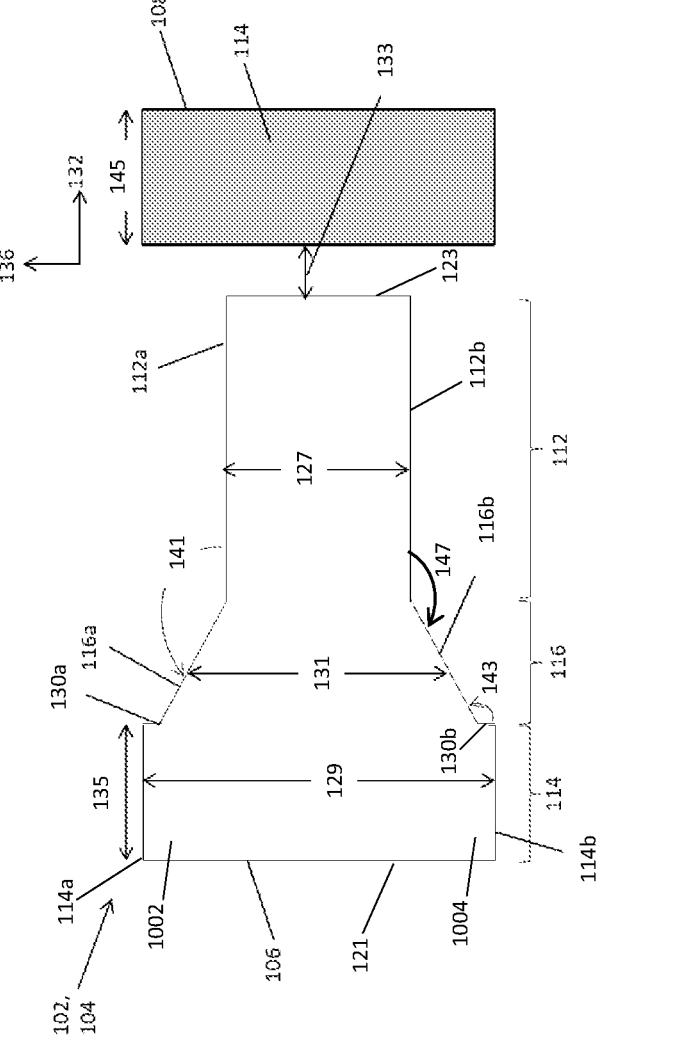
FIG. 1D illustrates a side perspective view of an electrode layer of the capacitor of FIG. 1A in accordance with another embodiment of the present invention.

In a further embodiment as illustrated in FIG. 1D, the connecting section 116 may also form an angle 143 with the base section 114. For instance, the base section 114 may have a first lateral edge portion 130a extending in the Z-direction 136 and a second lateral edge portion 130b extending in the Z-direction 136, the first and second lateral edge portions 130a, 130b intersecting the first connecting edge 116a and the second connecting edge 116b, respectively. At least a portion of the second connecting edge 116b may not be perpendicular to the vertical edge 130 of the base section 114, e.g., such vertical edge 130 may form an angle 143 with the second connecting edge 116b of the connecting section 116. Similarly, at least a portion of the first connecting edge 116a may not be perpendicular to the vertical edge 130 of the base section 114 such that the angle 143 is also defined between the first connecting edge 116a and the vertical edge 130. Such angle 143 may be greater than 90° and less than 180°. For instance, such angle 143 may be greater than 90°, such as 95° or more, such as 100° or more, such as 110° or more, such as 120° or more, such as 130° or more, such as 140° or more. Such angle 143 may be less than 180°, such as 175° or less, such as 170° or less, such as 160° or less, such as 150° or less, such as 140° or less, such as 130° or less, such as 120° or less, such as 110° or less. vertical edge 130.

Figure 1E:
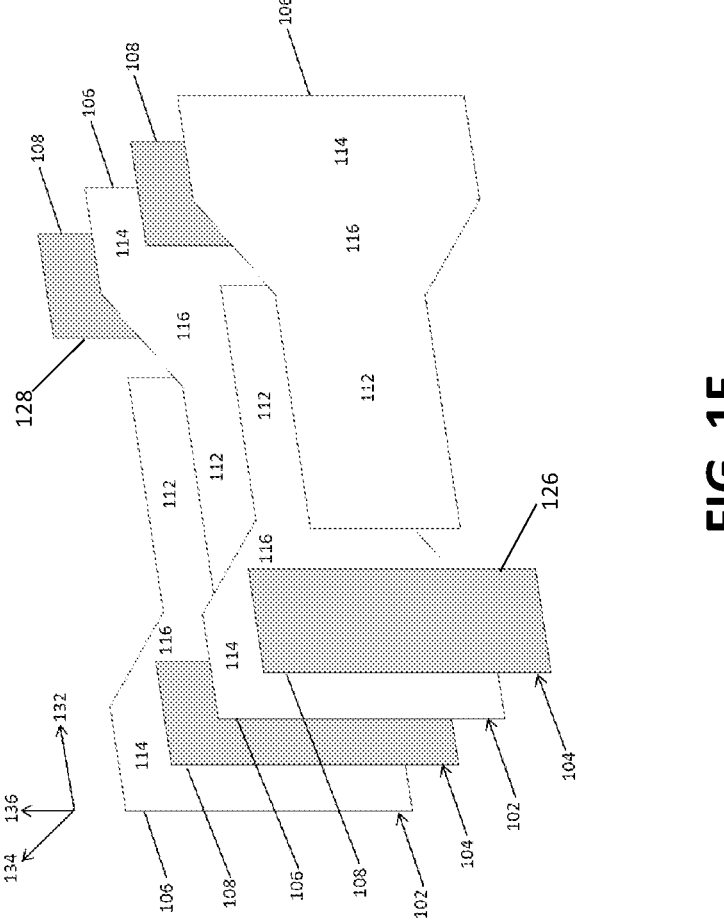
FIG. 1E illustrates a perspective view of one embodiment of an arrangement of electrode layers of the present invention.
Figure 1F:
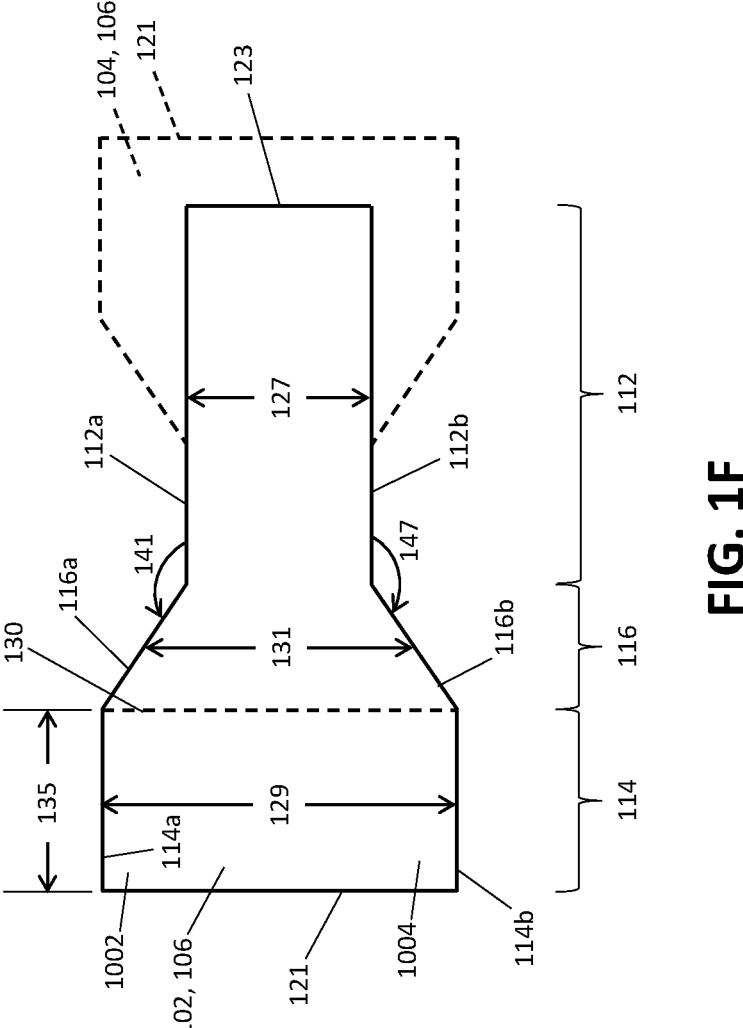
FIG. 1F illustrates a side perspective view of an electrode layer of the capacitor of FIG. 1A in accordance with another embodiment of the present invention.
Figure 1F:
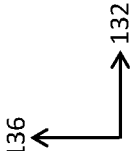

It will be appreciated that the embodiment of FIG. 1F is substantially similar to the embodiments of FIGS. 1C-1E, however, the embodiment of the electrode layers 102, 104 of FIG. 1F omits the second electrodes 108 and includes only first electrodes 106. Otherwise, the first electrode shown in FIG. 1F has the same configuration as the first electrodes 106 shown in FIGS. 1C and 1D, generally having a Y-shape with at least a portion of a connecting edge 116a, 116b being not perpendicular to the respective edge 112a, 112b with which the connecting edge 116a, 116b intersects. Further, it will be appreciated that, in some embodiments, the capacitor 10 may include electrode layers 102, 104 having only first electrodes 106 configured as shown in FIG. 1D and omitting second electrodes 108 within one or more electrode layers 102, 104 of the stack of dielectric and electrode layers.

As illustrated, the connecting edges 116a, 116b of the connecting section 116 may extend in both the longitudinal direction 132 and the Z-direction 136. In one embodiment, such edge may be a linear edge such that the connecting edge 116a, 116b is substantially linear. Such linear edge is illustrated in FIGS. 1C and 1D. In another embodiment, such edge may be a curved edge having a curved/rounded configuration.

Figure 1G:
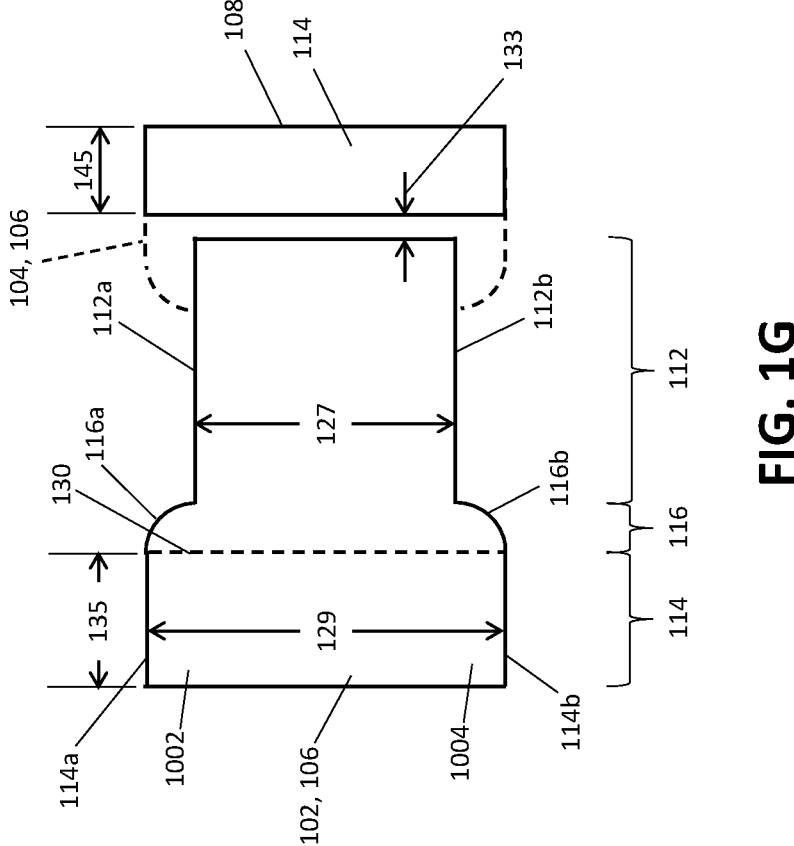
FIG. 1G illustrates a side perspective view of an electrode layer of the capacitor of FIG. 1A in accordance with still another embodiment of the present invention.
Figure 1G:
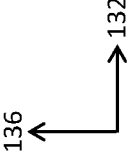

For example, FIG. 1G illustrates an electrode layer 102, 104 having a curved or rounded connecting edge 116a, 116b. That is, FIG. 1G illustrates an electrode layer 102, 104 in which at least one of the first electrode 106 or second electrode 108 has at least one rounded corner. As used herein, "rounded" may refer to a perimeter having the shape of a circular or elliptical arc. "Rounded" may also refer to any suitable edge that is not precisely circular or elliptical but is otherwise curved/arcuate.

Additionally, in some embodiments, a perimeter of the first electrode 106 and/or second electrode 108 may be free of geometric discontinuities. For example, the rounded corner(s) may continuously blend into an adjacent straight edge without any geometric discontinuities. In some embodiments, at least one of the first electrode 106 and/or second electrode 108 may have a shape that is geometrically continuous. In other words, there may be no discontinuities in a coordinate function that describes the shape (e.g., in Cartesian or polar coordinates). In some embodiments, the shape may be geometrically continuous to a first order. In other words, a first order derivative of a coordinate function that describes the shape of the first electrode 106 and/or second electrode 108 may contain no discontinuities.

Such a rounded corner configuration may reduce electric field and charge concentrations in the rounded corners and/or along the edges of the electrodes 106, 108 adjacent the rounded corners. Such a reduction may increase the breakdown voltage of a capacitor incorporating the electrode layers 102, 104 compared with conventional electrode configurations.

As described herein, a corner may be the intersection between two edges of an electrode 106, 108. In some embodiments each corner of the first electrode 106 and each corner of the second electrode 108 may be rounded. However, in other embodiments, such as shown in FIG. 1G, some of the electrode corners are rounded and others are not rounded. For example, in the illustrated embodiment, the first connecting edge 116*a* and the second connecting edge 116*b* are each curved or rounded such that at least a portion of each connecting edge 116*a*, 116*b* is not perpendicular to the first edge 112*a* and second edge 112*b*, respectively, and the first electrode 106 has two rounded corners at the transition from the base section 114 to the central section 112. Producing rounded corners may involve additional manufacturing cost compared with non-rounded corners; thus, a mixed corner configuration may provide similar benefits to embodiments having more (e.g., all) rounded corners, with reduced manufacturing costs.

It should be understood that additional configurations with respect to the rounded and non-rounded corners are possible within the scope of this disclosure. For example, in some embodiments, the second electrode 108 may similarly have two rounded corners and two non-rounded corners, e.g., the rounded corners of the second electrode 108 may be adjacent the first electrode 106 and the non-rounded corners of the second electrode 108 may face away from the first electrode 106. In other embodiments, the first electrode 106 may have only rounded corners while the second electrode 108 has only non-rounded corners, and in still other embodiments, the first electrode 106 may not have any rounded corners while the second electrode 108 has only rounded corners.

Other variations and/or combinations are possible within the scope of this disclosure. For example, the first electrodes 106 may have a generally Y-shaped electrode configuration as well as one or more rounded corners. A different number and/or configuration of connecting edges that are not perpendicular to an edge of the central section may be used in electrodes 106, 108 on various electrode layers 102, 104, e.g., one or more electrode layers 102, 104 may have an electrode 106, 108 with a different connecting section 116 configuration than at least one other electrode layer 102, 104.

As further shown in FIGS. 1C, 1D, 1F, and 1G, each leading edge 114*a*, 114*b* of the base section 114 of first electrode 106 may also have a certain length 135 extending in the longitudinal direction 132. In general, such length 135 of the base section may be defined as the distance between the vertical edge 121 and the point of transition between the base section 114 and the connecting section 116. For instance, each of the first leading edge 114*a* and second leading edge 114*b* may generally have a slope of 0° and the point at which the slope changes may be considered the aforementioned point of transition. Regardless, such length may be 0.05 or more, such as 0.1 or more, such as 0.15 or more, such as 0.2 or more, such as 0.3 or more the capacitor length 15 as defined herein. Such length 135 may be 0.5 or less, such as 0.4 or less, such as 0.3 or less, such as 0.25 or less, such as 0.2 or less, such as 0.15 or less the capacitor length 15.

As also illustrated in FIGS. 1C, 1D, and 1G, the base section 114 of second electrode 108 may also have a certain length 145 extending in the longitudinal direction 132. Such length may be 0.05 or more, such as 0.1 or more, such as 0.15 or more, such as 0.2 or more, such as 0.3 or more the capacitor length 15. Such length 145 may be 0.5 or less, such as 0.4 or less, such as 0.3 or less, such as 0.25 or less, such as 0.2 or less, such as 0.15 or less the capacitor length 15.

In one embodiment, the aforementioned lengths 135 and 145 may be different. In one particular embodiment, the aforementioned lengths 135 and 145 may be substantially the same.

Further, the first external termination 12 may have a first lateral edge 122 (FIG. 1A). The first lateral edge 122 may extend in a Z-direction 136 and/or a lateral direction 134. The first lateral edge 122 may define a termination width BW of the first external termination 12; the second external termination 14 may also have a termination width BW. The external terminations 12, 14 have a termination length BL along the top surface 18*a*, the termination length BL extending in the longitudinal direction 132.

The first lateral edge 122 of the first external termination 12 may substantially align with the vertical edge 130 of the base section 114 of first electrode 106 in the longitudinal direction. Such vertical edge 130 may be at a location wherein the base section 114 ends and the connecting section 116 begins. For instance, the first lateral edge 122 of the first external termination 12 may be within 5%, such as within 4%, such as within 3%, such as within 2%, such as within 1%, such as within 0.8%, such as within 0.6%, such as within 0.5%, such as within 0.4%, such as within 0.3%, such as within 0.2%, such as within 0.1% of the vertical edge 130 of the base section 114 of first electrode 106 in the longitudinal direction based on the length of the base section 114 of first electrode 106.

Similarly, the second external termination 14 may have a second lateral edge 124 (FIG. 1A). The second lateral edge 124 may extend in a Z-direction 136 and/or a lateral direction 134. The second lateral edge 124 of the second external termination 14 may substantially align with a vertical edge 130 of the base section 114 of first electrode 106 in the longitudinal direction. Such vertical edge 130 may be at a location wherein the base section 114 ends and the connecting section 116 begins. For instance, the second lateral edge 124 of the second external termination 14 may be within 5%, such as within 4%, such as within 3%, such as within 2%, such as within 1%, such as within 0.8%, such as within 0.6%, such as within 0.5%, such as within 0.4%, such as within 0.3%, such as within 0.2%, such as within 0.1% of the vertical edge 130 of the base section 114 of first electrode 106 in the longitudinal direction based on the length of the base section 114 of first electrode 106.

In addition, the first lateral edge 122 of the first external termination 12 may substantially align with a lateral edge 126 (FIG. 1E) of the base section 114 of second electrode 108 of electrode layers 104 in the longitudinal direction. For instance, the first lateral edge 122 of the first external termination 12 may be within 5%, such as within 4%, such as within 3%, such as within 2%, such as within 1%, such as within 0.8%, such as within 0.6%, such as within 0.5%, such as within 0.4%, such as within 0.3%, such as within 0.2%, such as within 0.1% of the lateral edge 126 of the base section 114 of second electrode 108 in the longitudinal direction based on the length of the base section 114 of second electrode 108.

Similarly, the second lateral edge 124 of the second external termination 14 may substantially align with a lateral edge 128 (FIG. 1E) of the base section 114 of second electrode 108 of electrode layers 102 in the longitudinal direction. For instance, the second lateral edge 124 of the second external termination 14 may be within 5%, such as within 4%, such as within 3%, such as within 2%, such as within 1%, such as within 0.8%, such as within 0.6%, such as within 0.5%, such as within 0.4%, such as within 0.3%, such as within 0.2%, such as within 0.1% of the lateral edge 128 of the base section 114 of second electrode 108 in the longitudinal direction based on the length of the base section 114 of second electrode 108.

As indicated herein, the dielectric layers and electrode layers may be stacked to form a set of alternating layers. As described elsewhere herein, one, two, three, four, or more sets of stacked, alternating dielectric and electrode layers may be disposed within a single capacitor body. The capacitor 10 includes one single set of dielectric and electrode layers to form the body 16 of the capacitor 10, but a capacitor body may include additional sets of stacked layers, e.g., as described with respect to FIGS. 3A-5B.

Referring to FIG. 1E, a plurality of first electrode layers 102 and a plurality of second electrode layers 104 may be arranged in an alternating, mirrored configuration. For instance, the electrode layers may interleaved in an opposed and spaced apart relation with a dielectric layer located between each electrode layer. As illustrated, the central sections 112 of the respective electrode layers at least partially overlap. FIG. 1E illustrates a total of four electrode layers; however, it should be understood that any number of electrode layers may be employed to obtain the desired capacitance for the desired application. For instance, the capacitor may include 10 or more, such as 25 or more, such as 50 or more, such as 100 or more, such as 200 or more, such as 300 or more, such as 500 or more, such as 600 or more, such as 750 or more, such as 1,000 or more internal electrode layers. The capacitor may include 5,000 or less, such as 4,000 or less, such as 3,000 or less, such as 2,000 or less, such as 1,500 or less, such as 1,000 or less, such as 750 or less, such as 500 or less, such as 400 or less, such as 300 or less, such as 250 or less, such as 200 or less, such as 175 or less, such as 150 or less internal electrode layers.

The present invention provides a multilayer capacitor having a unique electrode arrangement and configuration that provides various benefits and advantages as indicated herein. In this regard, it should be understood that the materials employed in constructing the capacitor may not be limited and may be any as generally employed in the art and formed using any method generally employed in the art.

In general, the dielectric layers may typically be formed from certain types of materials having certain dielectric constants. For instance, in one embodiment, the dielectric layers may be formed from a material having a relatively high dielectric constant (K). Such dielectric constant may be more than 125, such as 200 or more, such as 500 or more, such as 1,000 or more to about 40,000 or less, such as about 30,000 or less, such as about 20,000 or less. In other embodiments, the dielectric layers may be formed from a material having a relatively low dielectric constant (K). For instance, the dielectric constant may be 10 or more, such as 15 or more, such as 20 or more, such as 30 or more, such as 40 or more, such as 50 or more, such as 60 or more, such as 70 or more, such as 80 or more, such as 90 or more. The dielectric constant may be 125 or less, such as 110 or less, such as 100 or less, such as 90 or less, such as 80 or less, such as 70 or less, such as 60 or less, such as 50 or less, such as 40 or less, such as 30 or less, such as 20 or less.

In general, these materials may include a ceramic. The ceramic may be provided in a variety of forms, such as a wafer (e.g., pre-fired) or a dielectric material that is co-fired within the device itself. Particular examples of these types of materials include, for instance, NPO (COG), X7R (from about 3,000 to about 7,000), X7S, ZSU, and/or Y5V materials. It should be appreciated that the aforementioned materials are described by their industry-accepted definitions, some of which are standard classifications established by the Electronic Industries Alliance (EIA), and as such should be recognized by one of ordinary skill in the art.

In one particular embodiment, the dielectric layers may comprise an NPO (COG) material. In general, these materials are recognized as EIA Class I ceramic materials. These materials may have a relatively low temperature coefficient. For instance, without intending to be limited by theory, these materials may have minimal variance in capacitance as a function of temperature. In addition, such materials may also have relatively low dielectric constants as indicated above. Accordingly, such materials may have a relatively small capacitance per volume.

For example, these materials may have a capacitance change with temperature of 0±30 ppm/° C., such as 0±25 ppm/° C., such as 0±20 ppm/° C., such as 0±15 ppm/° C., such as 0±10 ppm/° C., such as 0±5 ppm/° C., such as 0 ppm/° C. In other words, these materials may undergo a change in ±0.3%, such as ±0.25%, such as ±0.2%, such as ±0.15%, such as ±0.1%, such as ±0.05%, such as 0% from −55° C. to 125° C. For the aforementioned, the capacitance value at 25° C. may be used as the reference point. In this regard, the capacitance may range from 10 pF to 0.01 μF. For instance, the capacitance may be 0.5 pF or more, such as 1 pF or more, such as 5 pF or more, such as 10 pF or more, such as 50 pF or more, such as 100 pF or more, such as 200 pF or more, such as 500 μF or more, such as 800 pF or more, such as 1 nF or more, such as 5 nF or more. The capacitance may be 10 nF or less, such as 8 nF or less, such as 5 nF or less, such as 3 nF or less, such as 1 nF or less, such as 900 pF or less, such as 700 pF or less, such as 500 pF or less, such as 300 pF or less, such as 200 pF or less, such as 100 pF or less, such as 50 pF or less, such as 20 pF or less. The aforementioned references to capacitance may refer to the capacitance of the capacitor.

These ceramic materials, including the NPO (COG) ceramic materials, and resulting dielectric layer may include a perovskite, such as barium titanate and related solid solutions (e.g., barium-strontium titanate, barium calcium titanate, barium zirconate titanate, barium strontium zirconate titanate, barium calcium zirconate titanate, etc.), lead titanate and related solid solutions (e.g., lead zirconate titanate, lead lanthanum zirconate titanate), sodium bismuth titanate, and so forth. In one particular embodiment, for instance, barium strontium titanate ("BSTO") of the formula $BaxSr_{1-x}TiO_3$ may be employed, wherein x is from 0 to 1, in some embodiments from about 0.15 to about 0.65, and in some embodiments, from about from 0.25 to about 0.6. In this regard, in one embodiment, the dielectric layers may include a titanate. Other suitable perovskites may include, for instance, $Ba_xCa_{1-x}TiO_3$ where x is from about 0.2 to about 0.8, and in some embodiments, from about 0.4 to about 0.6, $Pb_xZr_{1-x}TiO_3$ ("PZT") where x ranges from about 0.05 to about 0.4, lead lanthanum zirconium titanate ("PLZT"), lead titanate ($PbTiO_3$), barium calcium zirconium titanate ($BaCaZrTiO_3$), sodium nitrate ($NaNO_3$), $KNbO_3$, $LiNbO_3$, $LiTaO_3$, $PbNb_2O_6$, $PbTa_2O_6$, $KSr(NbO_3)$ and $NaBa_2(NbO_3)_5KHb_2PO_4$. Still additional complex perovskites may include $A[B1_{1/3}B2_{2/3}]O_3$ materials, where A is $Ba_xSr_{1-x}$ (x can be a value from 0 to 1); B1 is $Mg_yZn_{1-y}$ (y can be a value from 0 to 1); B2 is $Ta_zNb_{1-z}$ (z can be a value from 0 to 1). In this regard, in one embodiment, the materials and corresponding dielectric layers may include a titanate, such as a barium titanate.

In a further embodiment, these ceramic materials, including the NPO (COG) ceramic materials, and resulting dielectric layer may include an oxide. For example, the oxide may include zinc, zirconium, niobium, magnesium, tantalum, titanium, cobalt, strontium, neodymium, samarium, silicon, etc., or a mixture thereof. In one embodiment, the oxide may include a rare earth oxide. In one embodiment, the ceramic material may include at least titanium dioxide. In one embodiment, the ceramic material may include zirconium dioxide. In a further embodiment, the ceramic material may include silicon dioxide. In one embodiment, the ceramic material may include titanium dioxide, zirconium dioxide, silicon dioxide, or a mixture thereof.

In a further embodiment, these ceramic materials, including the NPO (COG) ceramic materials, and resulting dielectric layer may include a combination of a titanate and an oxide. In particular, they may include a combination of a barium titanate and an oxide.

The electrodes and electrode layers may be formed from any of a variety of different metals as is known in the art. The electrode layers may be made from a metal, such as a conductive metal. The materials may include precious metals (e.g., silver, gold, palladium, platinum, etc.), base metals (e.g., copper, tin, nickel, chrome, titanium, tungsten, aluminum, zinc, etc.), and so forth, as well as various combinations thereof. Sputtered titanium/tungsten (Ti/W) alloys, as well as respective sputtered layers of chrome, nickel and gold, may also be suitable. The electrodes may also be made of a low resistive material, such as silver, copper, gold, aluminum, palladium, etc. In one particular embodiment, the electrode layers may comprise nickel or an alloy thereof. In another particular embodiment, the electrode layers may comprise copper or an alloy thereof.

Each electrode layer 102, 104 may include one or more electrodes, for example as described with reference to FIGS. 1C-1G. For example, in some embodiments each electrode layer 102, 104 may include a first electrode 106 and a second (counter) electrode 108, such as shown in FIGS. 1C-1E and 1G. In other embodiments, each electrode layer 102, 104 may include a single electrode, such as illustrated in FIG. 1F.

In general, the capacitor as described herein references certain electrode configurations. However, it should be understood that other types of electrodes and/or electrode layers as known in the art may also be utilized within the capacitor. For instance, these other electrodes and/or electrode layers may include, but are not limited to, shield electrodes, dummy electrodes, floating electrodes, etc. For instance, in one embodiment, the capacitor may include shield electrodes. In another embodiment, the capacitor may include dummy electrodes. In a further embodiment, the capacitor may include floating electrodes. In addition, such electrodes may have any shape as generally known in the art. However, in one embodiment, the capacitor may not include shield electrodes, dummy electrodes, and/or floating electrodes. For instance, in one embodiment, the capacitor may not include shield electrodes. In another embodiment, the capacitor may not include dummy electrodes. In a further embodiment, the capacitor may not include floating electrodes.

As shown in FIG. 1A, in addition to the body 16 including the dielectric layers and the electrode layers 102, 104, the capacitor 10 may also contain a first external termination 12 and a second external termination 14. The first external termination 12 may be connected, such as electrically connected, to the first electrode 106 of a first electrode layer 102 and a second (counter) electrode 108 of the second electrode layer 104. The second external termination 14 may be connected, such as electrically connected, to the first electrode 106 of the second electrode layer 104 and the second (counter) electrode 108 of the first electrode layer 102.

For instance, the first external termination 12 may be electrically connected to the first electrode layers 102 along at least one of the first leading edge 114a or the second leading edge 114b of the base portion 114 of the first electrode 106 of the first electrode layers 102. The second external termination 14 may be electrically connected to the second electrode layers 104 along at least one of the first leading edge 114a or the second leading edge 114b of the base portion 114 of the first electrode 106 of the second electrode layers 104. The leading edges 114a, 114b may assist in the formation of the external terminations 12, 14 as further described herein.

The external terminations 12 and 14 may be formed on respective end surfaces 18c and 18d of the body 16. However, the external terminations 12 and 14 may be present on other surfaces. For instance, the external terminations may extend to the top and bottom surfaces 18a, 18b, as well as the two side surfaces 18e, 18f. In particular, external termination 12 may extend to top surface 18a, bottom surface 18b, and side surfaces 18e, 18f. Similarly, external termination 14 may extend to top surface 18a, bottom surface 18b, and side surfaces 18e, 18f. In the embodiment shown in FIG. 1A, the first external termination 12 extends to top surface 18a, bottom surface 18b, and end surface 18c, and the second external termination 14 extends to top surface 18a, bottom surface 18b, and end surface 18d, such that the external terminations 12, 14 are spaced apart from the side surfaces 18c, 18d. In still further embodiments, the external terminations may be formed on only the top surface, only the bottom surface, or only the top and bottom surfaces, e.g., such that the external terminations are spaced apart from one or more of the end surfaces 18c, 18d or side surfaces 18e, 18f.

In general, the external terminations may have an average thickness of about 500 μm or less, such as about 400 μm or less, such as about 250 μm or less, such as about 150 μm or less, such as about 100 μm or less, such as about 50 μm or less, such as about 40 μm or less, such as about 30 μm or less, such as about 25 μm or less, such as about 20 μm or less. The external terminations may have an average thickness of about 5 μm or more, such as about 10 μm or more, such as about 15 μm or more, such as about 25 μm or more, such as about 50 μm or more, such as about. For instance, the external terminations may have an average thickness of from about 5 μm to about 50 μm, such as from about 10 μm to about 40 μm, such as from about 15 μm to about 30 μm, such as from about 15 μm to about 25 μm. In one embodiment, the aforementioned thicknesses refer to the average thickness of the entire external termination, for example one including more than one layer. In another embodiment, the aforementioned thicknesses refer to the average thickness of a single layer of an external termination.

Regarding embodiments discussed herein, the external terminations may be formed from any of a variety of different metals as is known in the art. The external terminations may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. In one particular embodiment, the external terminations may comprise copper or an alloy thereof.

The external terminations can be formed using any method generally known in the art. The external terminations may be formed using techniques such as sputtering, painting, printing, electroless plating or fine copper termination (FCT), electroplating, plasma deposition, propellant spray/air brushing, and so forth.

In one embodiment, the external terminations may be formed such that the external terminations are relatively thick. For instance, such terminations may be formed by applying a thick film stripe of a metal to exposed portions of electrode layers (e.g., by dipping the capacitor in a liquid external termination material). Such metal may be in a glass matrix and may include silver or copper. As an example, such strip may be printed and fired onto the capacitor. Thereafter, additional plating layers of metal (e.g., nickel, tin, solder, etc.) may be created over the termination strips such that the capacitor is solderable to a substrate. Such application of thick film stripes may be conducted using any method generally known in the art (e.g., by a termination machine and printing wheel for transferring a metal-loaded paste over the exposed electrode layers).

The thick-plated external terminations may have an average thickness of about 500 μm or less, such as about 300 μm or less, such as about 200 μm or less, such as about 150 μm or less, such as about 100 μm or less, such as about 80 μm or less. The thick-plated external terminations may have an average thickness of about 25 μm or more, such as about 35 μm or more, such as about 50 μm or more, such as about 75 or more μm. For instance, the thick-plated external terminations may have an average thickness of from about 25 μm to about 150 μm, such as from about 35 μm to about 125 μm, such as from about 50 μm to about 100 μm. In one embodiment, the aforementioned thicknesses refer to the average thickness of the entire external termination, for example one including more than one layer. In another embodiment, the aforementioned thicknesses refer to the average thickness of a single layer of an external termination.

In another embodiment, the external terminations may be formed such that the external termination is a thin-film plating of a metal. Such thin-film plating can be formed by depositing a conductive material, such as a conductive metal, on an exposed portion of an electrode layer. For instance, a leading edge of an electrode layer may be exposed such that it may allow for the formation of a plated termination.

The thin-plated external terminations may have an average thickness of about 50 μm or less, such as about 40 μm or less, such as about 30 μm or less, such as about 25 μm or less. The thin-plated external terminations may have an average thickness of about 5 μm or more, such as about 10 μm or more, such as about 15 μm or more. For instance, the external terminations may have an average thickness of from about 5 μm to about 50 μm, such as from about 10 μm to about 40 μm, such as from about 15 μm to about 30 μm, such as from about 15 μm to about 25 μm. In one embodiment, the aforementioned thicknesses refer to the average thickness of the entire external termination, for example one including more than one layer. In another embodiment, the aforementioned thicknesses refer to the average thickness of a single layer of an external termination.

In general, the external termination may comprise a plated termination. For instance, the external termination may comprise an electroplated termination, an electroless plated termination, or a combination thereof. For instance, an electroplated termination may be formed via electrolytic plating. An electroless plated termination may be formed via electroless plating.

When multiple layers constitute the external termination, the external termination may include an electroplated termination and an electroless plated termination. For instance, electroless plating may first be employed to deposit an initial layer of material. The plating technique may then be switched to an electrochemical plating system which may allow for a faster buildup of material.

When forming the plated terminations with either plating method, a leading edge of the electrode layers that is exposed from the main body of the capacitor is subjected to a plating solution. By subjecting, in one embodiment, the capacitor may be dipped into the plating solution.

The plating solution contains a conductive material, such as a conductive metal, is employed to form the plated termination. Such conductive material may be any of the aforementioned materials or any as generally known in the art. For instance, the plating solution may be a nickel sulfamate bath solution or other nickel solution such that the plated layer and external termination comprise nickel. Alternatively, the plating solution may be a copper acid bath or other suitable copper solution such that the plated layer and external termination comprise copper.

Additionally, it should be understood that the plating solution may comprise other additives as generally known in the art. For instance, the additives may include other organic additives and media that can assist in the plating process. Additionally, additives may be employed in order to employ the plating solution at a desired pH. In one embodiment, resistance-reducing additives may be employed in the solutions to assist with complete plating coverage and bonding of the plating materials to the capacitor and exposed leading edges of the electrodes.

The capacitor may be exposed, submersed, or dipped in the plating solution for a predetermined amount of time. Such exposure time is not necessarily limited but may be for a sufficient amount of time to allow for enough plating material to deposit in order to form the plated termination. In this regard, the time should be sufficient for allowing the formation of a continuous connection among the desired exposed, adjacent leading edges of the electrodes.

In general, the difference between electrolytic plating and electroless plating is that electrolytic plating employs an electrical bias, such as by using an external power supply. The electrolytic plating solution may be subjected typically to a high current density range, for example, ten to fifteen amp/ft² (rated at 9.4 volts). A connection may be formed with a negative connection to the capacitor requiring formation of the plated terminations and a positive connection to a solid material (e.g., Cu in Cu plating solution) in the same plating solution. That is, the capacitor is biased to a polarity opposite that of the plating solution. Using such method, the conductive material of the plating solution is attracted to the metal of the exposed leading edge of the electrode layers.

Prior to submersing or subjecting the capacitor to a plating solution, various pretreatment steps may be employed. Such steps may be conducted for a variety of purposes, including to catalyze, to accelerate, and/or to improve the adhesion of the plating materials to the leading edges of the electrodes.

Additionally, prior to plating or any other pretreatment steps, an initial cleaning step may be employed. Such step may be employed to remove any oxide buildup that forms on the exposed edges of the electrodes. This cleaning step may be particularly helpful to assist in removing any buildup of nickel oxide when the internal electrodes or other conductive elements are formed of nickel. Component cleaning may be effected by full immersion in a preclean bath, such as one including an acid cleaner. In one embodiment, exposure may be for a predetermined time, such as on the order of about 10 minutes. Cleaning may also alternatively be effected by chemical polishing or harperizing steps.

In addition, a step to activate the exposed metallic leading edges of the electrodes may be performed to facilitate depositing of the conductive materials. Activation can be achieved by immersion in palladium salts, photo patterned palladium organometallic precursors (via mask or laser), screen printed or ink-jet deposited palladium compounds or electrophoretic palladium deposition. It should be appreciated that palladium-based activation is presently disclosed merely as an example of activation solutions that often work well with activation for exposed tab portions formed of nickel or an alloy thereof. However, it should be understood that other activation solutions may also be utilized.

Also, in lieu of or in addition to the aforementioned activation step, the activation dopant may be introduced into the conductive material when forming the electrode layers of the capacitor. For instance, when the electrode layer comprises nickel and the activation dopant comprises palladium, the palladium dopant may be introduced into the nickel ink or composition that forms the electrode layers. Doing so may eliminate the palladium activation step. It should be further appreciated that some of the above activation methods, such as organometallic precursors, also lend themselves to co-deposition of glass formers for increased adhesion to the generally ceramic body of the capacitor. When activation steps are taken as described above, traces of the activator material may often remain at the exposed conductive portions before and after termination plating.

Additionally, post-treatment steps after plating may also be employed. Such steps may be conducted for a variety of purposes, including enhancing and/or improving adhesion of the materials. For instance, a heating (or annealing) step may be employed after performing the plating step. Such heating may be conducted via baking, laser subjection, UV exposure, microwave exposure, arc welding, etc.

As indicated herein, the external termination may include at least one plating layer. In one embodiment, the external termination may comprise only one plating layer. However, it should be understood that the external terminations may comprise a plurality of plating layers. For instance, the external terminations may comprise a first plating layer and a second plating layer. In addition, the external terminations may also comprise a third plating layer. The materials of these plating layers may be any of the aforementioned and as generally known in the art.

For instance, one plating layer, such as a first plating layer, may comprise copper or an alloy thereof. Another plating layer, such as a second plating layer, may comprise nickel or an alloy thereof. Another plating layer, such as a third plating layer, may comprise tin, lead, gold, or a combination, such as an alloy. Alternatively, an initial plating layer may include nickel, following by plating layers of tin or gold. In another embodiment, an initial plating layer of copper may be formed and then a nickel layer.

In one embodiment, initial or first plating layer may be a conductive metal (e.g., copper). This area may then be covered with a second layer containing a resistor-polymeric material for sealing. The area may then be polished to selectively remove resistive polymeric material and then plated again with a third layer containing a conductive, metallic material (e.g., copper).

The aforementioned second layer above the initial plating layer may correspond to a solder barrier layer, for example a nickel-solder barrier layer. In some embodiments, the aforementioned layer may be formed by electroplating an additional layer of metal (e.g., nickel) on top of an initial electrolessly or electrolytically plated layer (e.g., plated copper). Other exemplary materials for layer the aforementioned solder barrier layer include nickel-phosphorus, gold, and silver. A third layer on the aforementioned solder-barrier layer may in some embodiments correspond to a conductive layer, such as plated Ni, Ni/Cr, Ag, Pd, Sn, Pb/Sn or other suitable plated solder.

In addition, a layer of metallic plating may be formed followed by an electroplating step to provide a resistive alloy or a higher resistance metal alloy coating, for example, electroless Ni—P alloy over such metallic plating. It should be understood, however, that it is possible to include any metal coating as those of ordinary skill in the art will understand from the complete disclosure herewith.

It should be appreciated that any of the aforementioned steps can occur as a bulk process, such as a barrel plating, fluidized bed plating and/or flow-through plating termination processes, all of which are generally known in the art. Such bulk processes enable multiple components to be processed at once, providing an efficient and expeditious termination process. This is a particular advantage relative to conventional termination methods, such as the printing of thick-film terminations that require individual component processing.

As described herein, the formation of the external terminations or external terminations is generally guided by the position of the exposed edges of the internal electrode layers. Such phenomena may be referred to as "self-determining" because the formation of the external plated terminations is determined by the configuration of the exposed conductive metal of the electrode layers at the selected peripheral locations on the capacitor. In some embodiments, the capacitor may include "dummy tabs" to provide exposed conductive metal along portions of the body of the capacitor that does not include other electrodes (e.g., active or shield electrodes). In some embodiments, one or more "dummy tabs," "dummy electrodes," anchor tabs, and/or anchor electrodes may, e.g., be added features for a nucleate function occurring such as during an FCT (fine copper termination, electroless plating) process. Such dummy or anchor tabs or electrodes may be positioned internally or externally relative to the body of the component to nucleate metallized plating material to form external plated terminations in an FCT process. For instance, a first plurality of dummy tabs may be connected with the first external termination, and a second plurality of dummy tabs may be connected with the second external termination. In general, the second electrodes 108 of the internal electrode layers 102, 104 may be dummy or anchor tabs or electrodes that assist in the formation of the first external termination 12 and the second external termination 14.

The second electrodes (i.e., the dummy or anchor tabs or electrodes) may have any configuration known in the art. For instance, in some embodiments, such as shown in the figures, the second electrodes may have a rectangular configuration or shape, while in other embodiments, the second electrodes may have a C-shaped configuration or an L-shaped configuration. For example, the second electrodes may have a base section and at least one, such as two, electrode arms extending from the base section, in particular from the lateral ends of the base section. Such electrode arms may extend in the longitudinal direction away from an end of the capacitor body. Such electrode arms of the second electrodes may also be longitudinally aligned. It will be appreciated, however, that the second electrodes may have any shape as generally known in the art.

Additional aspects of the above-described technology for forming thin-film plated terminations are described in U.S. Pat. No. 7,177,137 to Ritter et al. and U.S. Pat. No. 7,463,474 to Ritter et al., which are incorporated by reference herein for all purposes. It should be appreciated that additional technologies for forming capacitor terminations may also be within the scope of the present technology. Exemplary alternatives include, but are not limited to, formation of terminations by plating, magnetism, masking, electrophoretics/electrostatics, sputtering, vacuum deposition, printing, or other techniques for forming both thick-film or thin-film conductive layers.

Referring back to the figures and in particular FIGS. 1A and 1B, in some embodiments, the first lateral edge 122 of the first external termination 12 may be offset in the longitudinal direction 132 and face away from end surface 18c. The second lateral edge 124 of the second external termination 14 may be offset in the longitudinal direction and face away from end surface 18d. Referring to FIG. 1B, the second lateral edge 124 may be offset in the longitudinal direction 132 from the first lateral edge 122 by an external termination gap distance 39. In this regard, the external termination gap distance 39 may be formed in the longitudinal direction 132.

The external termination gap distance 39 may be about 100 μm or more, such as about 150 μm or more, such as about 200 μm or more, such as about 300 μm or more, such as about 400 μm or more, such as about 500 μm or more, such as about 600 μm or more. The external termination gap distance 39 may be about 1,000 μm or less, such as about 900 μm or less, such as about 800 μm or less, such as about 700 μm or less, such as about 600 μm or less.

Referring to FIGS. 1A and 1B, in some embodiments, the multilayer capacitor 10 may have a capacitor length 13 in the longitudinal direction 132 between the ends of the capacitor, i.e., including the external terminations at the ends 18c, 18d. The capacitor length 13 may be about 600 μm or more, such as about 700 μm or more, such as about 800 μm or more, such as about 900 μm or more, such as about 1,000 μm or more, such as about 1,200 μm or more, such as about 1,400 μm or more. The capacitor length 13 may be about 3,000 μm or less, such as about 2,500 μm or less, such as about 2,200 μm or less, such as about 1,800 μm or less, such as about 1,600 μm or less, such as about 1,500 μm or less, such as about 1,400 μm or less, such as about 1,300 μm or less, such as about 1,200 μm or less, such as about 1,100 μm or less. Accordingly, in one embodiment, a ratio of the external termination gap distance 39 to the capacitor length 13 may be 0.1 or more, such as 0.2 or more, such as 0.3 or more, such as 0.4 or more, such as 0.5 or more, such as 0.6 or more, such as 0.7 or more. The ratio may be 0.9 or less, such as 0.8 or less, such as 0.7 or less, such as 0.6 or less, such as 0.5 or less.

Similarly, in some embodiments, the body 16 of the capacitor 10 may have a body length 15 in the longitudinal direction 132 between the end surfaces 18c, 18d of the capacitor body 16. The body length 15 may be about 600 μm or more, such as about 700 μm or more, such as about 800 μm or more, such as about 900 μm or more, such as about 1,000 μm or more, such as about 1,200 μm or more, such as about 1,400 μm or more. The body length 15 may be about 3,000 μm or less, such as about 2,500 μm or less, such as about 2,200 μm or less, such as about 1,800 μm or less, such as about 1,600 μm or less, such as about 1,500 μm or less, such as about 1,400 μm or less, such as about 1,300 μm or less, such as about 1,200 μm or less, such as about 1,100 μm or less. Accordingly, in one embodiment, a ratio of the external termination gap distance 39 to the body length 15 may be 0.1 or more, such as 0.2 or more, such as 0.3 or more, such as 0.4 or more, such as 0.5 or more, such as 0.6 or more, such as 0.7 or more. The ratio may be 0.9 or less, such as 0.8 or less, such as 0.7 or less, such as 0.6 or less, such as 0.5 or less.

In one embodiment, the capacitor 10, or a portion thereof, may be symmetric about a longitudinal centerline that extends in the longitudinal direction 132. In another embodiment, the capacitor 10, or a portion thereof, may be symmetric about a lateral centerline that extends in the lateral direction 134. In a further embodiment, the capacitor 10, or a portion thereof, may be symmetric about a Z-direction centerline that extends in the Z-direction 136.

As illustrated in FIGS. 1A and 1B, the capacitor 10 includes two external terminations formed on the top surface and bottom surface. However, as indicated above, the present invention is not limited by the number of external terminations.

Figure 2A:
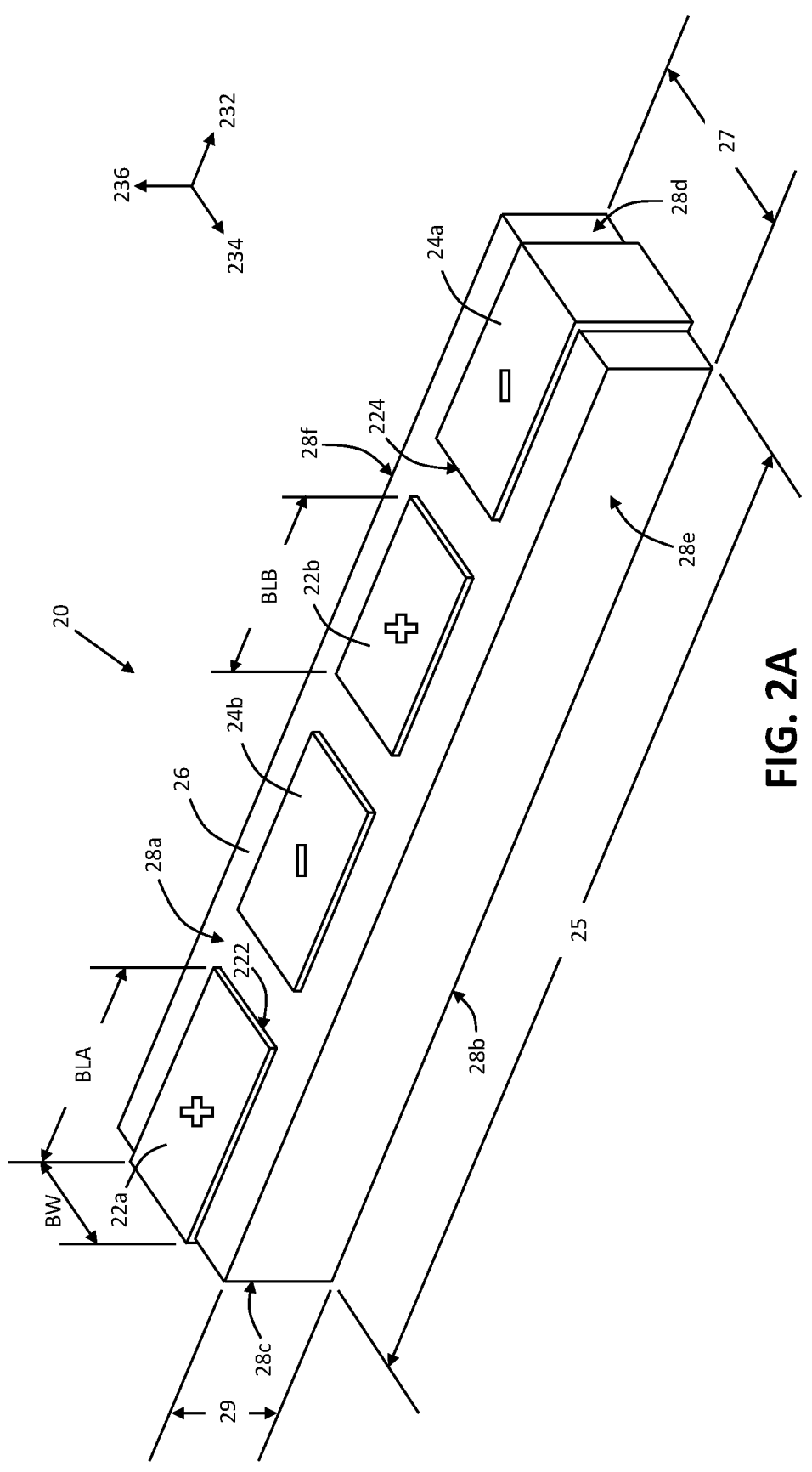
FIG. 2A illustrates a top view of another embodiment of an electrode of the present invention.

For instance, FIG. 2A illustrates a capacitor 20 containing four external terminations on each of the top surface and bottom surface. Similar reference numerals are used in FIGS. 2A-2C as in FIGS. 1A-1G to denote the same or similar features.

As illustrated in FIG. 2A, the capacitor 20 has a 1 by 4 configuration. That is, the capacitor 20 includes two external terminals arranged in a linear fashion in a single dimension on a top surface and a bottom surface of the capacitor. In the depicted embodiment, the capacitor 20 includes external terminals arranged in a linear fashion or a single row along a longitudinal direction L, which may be referred to as a linear terminal arrangement. In this regard, the capacitor 20 includes a body 26 having a total of four external terminations 22a, 22b, 24a, 24b on a top surface 28a and four corresponding external terminations (not shown) on a bottom surface 28b, where the external terminations 22a, 22b, 24a, 24b on the top surface 28a are electrically connected to the corresponding external terminations 22a, 22b, 24a, 24b on the bottom surface 28b. Further, in the depicted embodiment, the external terminations 22a, 22b, 24a, 24b are spaced apart from side surfaces 28e, 28f of the capacitor body 26 such that only dielectric material is disposed between the external terminations 22a, 22b, 24a, 24b and the side surfaces 28e, 28f.

In addition, the external terminations 22a, 24a extend along a respective end surface 28c, 28d of the body 26 from the top surface 28a to the bottom surface 28b. For example, the external termination 22a wraps around from the top surface 28a along the end surface 28c to the bottom surface 28b, and the external termination 24a wraps around from the top surface 28a along the end surface 28d to the bottom surface 28b. The external terminations 22a, 24a may be referred to as end external terminations.

A first external termination 22a and a third external termination 22b may be connected, such as electrically connected, to the first electrode 206 of the first electrode layer 202 and a second (counter) electrode 208 of the second electrode layer 204. A second external termination 24a and a fourth external termination 24b may be connected, such as electrically connected, to the first electrode 206 of the second electrode layer 204 and the second (counter) electrode 208 of the first electrode layer 202.

For instance, the first external termination 22a may be electrically connected to the first electrode layers 202 along at least one of the first leading edge 214a or the second leading edge 214b of the first base portion 214-1 of the first electrode 206 of the first electrode layers 202. The second external termination 24a may be electrically connected to the second electrode layers 204 along at least one of the first leading edge 214a or the second leading edge 214b of the first base portion 214-1 of the first electrode 206 of the second electrode layers 204. The third external termination 22b may be electrically connected to the first electrode layers 202 along at least one of the third leading edge 214c or the fourth leading edge 214d of the second base portion 214-2 of the first electrode 206 of the first electrode layers 202. The fourth external termination 24b may be electrically connected to the second electrode layers 204 along at least one of the third leading edge 214c or the fourth leading edge 214d of the second base portion 214-2 of the first electrode 206 of the second electrode layers 204. The leading edges 214a, 214b, 214c, 214d may assist in the formation of the external terminations 22a, 22b, 24a, 24b as further described herein.

Additionally, the capacitor 20 of FIG. 2A includes at least one first polarity termination and at least one second and opposite polarity termination on a top surface. Although not shown, the bottom surface includes at least a first polarity termination and a second and opposite termination. In particular, as shown in FIG. 2A, the capacitor 20 includes two positive terminations 22a, 22b and two negative terminations 24a, 24b on the top surface 28a.

The body 26 of the capacitor 20 has a length 25 extending in a longitudinal direction 232, which may be measured from one end surface 28c to the opposing end surface 28d. Further, the body 26 of the capacitor 20 has a width 127 extending in a lateral direction 234, which may be measured from one side surface 28e to the opposing side surface 28e. Moreover, the body 26 of the capacitor 20 has a height 29 extending in the Z-direction 236, which may be measured from the top surface 28a to the opposing bottom surface 28b.

As shown in FIG. 2A, the external terminations 22a, 22b, 24a, 24b each have a termination width BW extending in the lateral direction 234. The external terminations 22a, 24a also have a termination length BLA along the top surface 18a, the termination length BLA extending in the longitudinal direction 232. Similarly, the external terminations 22b, 24b have a termination length BLB along the top surface 18a that extends in the longitudinal direction 232. It will be appreciated that one or both terminations 22a, 24a or one or both terminations 22b, 24b may have a termination length BLA or BLB, respectively along the bottom surface 18b, which may be the same as or different than the respective termination length BLA, BLB along the top surface 18a.

Although not shown herein, it will be appreciated that the capacitor 20 may be mounted to a mounting surface, e.g., a printed circuit board or substrate, such as the mounting surface 11 shown in FIG. 1B. In this regard, the multilayer capacitor may be configured for mounting to a mounting surface such that the electrode layers are perpendicular to the mounting surface.

As shown in the figures, the multilayer capacitor 20 may be configured substantially similar to the multilayer capacitor 10 described with respect to FIGS. 1A-1B. However, the multilayer capacitor 20 has first and second electrode layers 202, 204 having multiple base sections 214, connecting sections 216, and central sections 212 as further described below.

The multilayer capacitor 20 may include a plurality of electrode layers 202, 204 and dielectric layers stacked in the lateral direction 234. Some dielectric layers may include electrode layers formed thereon. In general, the thickness of the dielectric layers and the electrode layers is not limited and can be any thickness as desired depending on the performance characteristics of the capacitor.

Figure 2B:
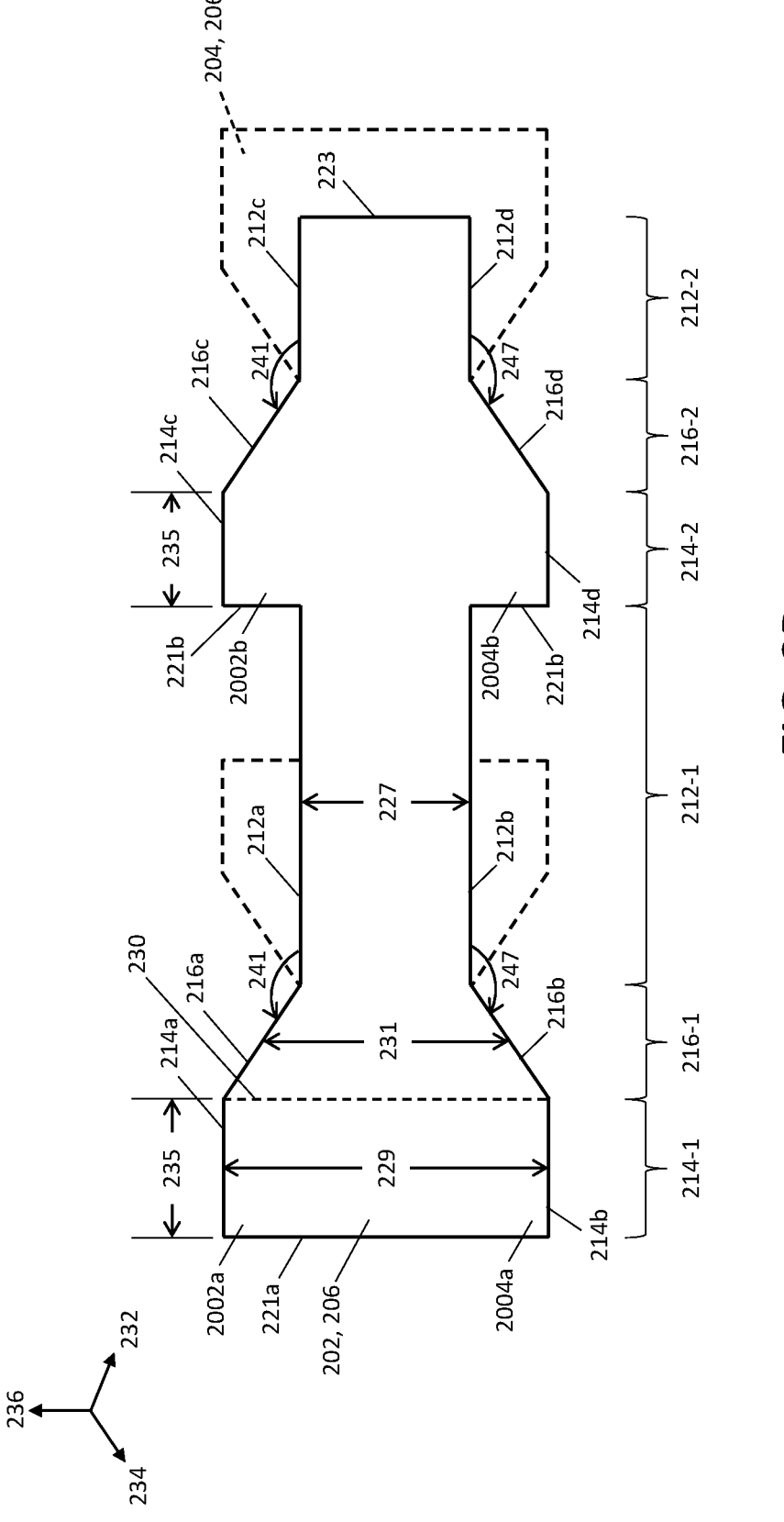
FIGS. 2B and 2C illustrate side perspective views of an electrode layer of the capacitor of FIG. 2A in accordance with various embodiments of the present invention.
Figure 2C:
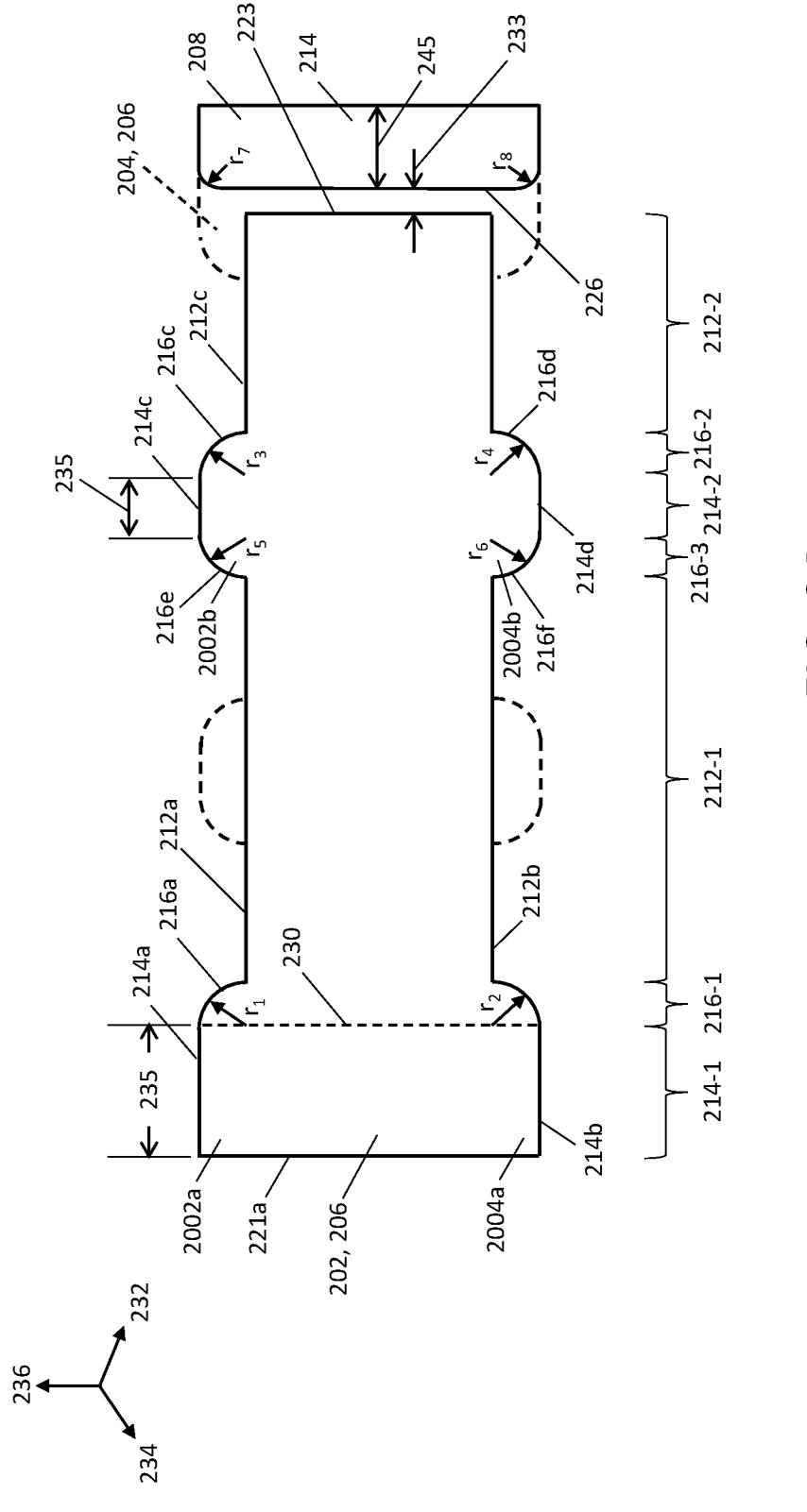

FIG. 2B illustrates a side view of one embodiment of an electrode configuration according to aspects of the present disclosure, and FIG. 2C illustrates a side view of one embodiment of an electrode configuration according to aspects of the present disclosure. The electrode configuration of FIG. 2B may be described as a generally Y-shaped electrode configuration, including multiple Y-shapes, similar to the embodiments of FIGS. 1C-1F, and the electrode configuration of FIG. 2C may be described as a generally multi-tab rounded edge configuration, similar to the embodiment of FIG. 1G. Each of the electrode configurations shown in FIGS. 2B and 2C has at least a portion of at least one edge that is not perpendicular to an edge it intersects.

Referring specifically to FIG. 2B, each electrode layer 202, 204 may include a first electrode 206. Although not shown, it will be appreciated that, in some embodiments, the electrode layers 202, 204 also may include a second electrode 208, such as shown in FIG. 2C and similar to the embodiments of FIGS. 1C-1E. The first electrode 206 may have a first base section 214-1 and a second base section 214-2. For instance, each of the first base section 214-1 and the second base section 214-2 of the first electrode 206 may extend in the longitudinal direction 232 and have a vertical edge 221a, 221b, respectively, that extends in the Z-direction 236. The first base section 214-1 may also include a first leading edge 214a and a second leading edge 214b opposite the first leading edge 214a along the Z-direction 236. The first and second leading edges 214a, 214b each extend in the longitudinal direction 232 and intersect the first vertical edge 221a such that the edges 214a, 214b, 221a define the boundaries of the first electrode 206 in the first base section 214-1. Similarly, the second base section 214-2 may also include a third leading edge 214c and a fourth leading edge 214d opposite the third leading edge 214c along the Z-direction 236. The third and fourth leading edges 214c, 214c each extend in the longitudinal direction 232 and intersect the second vertical edge 221b such that the edges 214c, 214d, 221b define the boundaries of the first electrode 206 in the second base section 214-2.

The first electrode 206 may also have a first central section 212-1 and a second central section 212-2. The first central section 212-1 may extend in the longitudinal direction 232 to the second vertical edge 221b of the second base section 214-2. The second central section 212-2 may extend in the longitudinal direction 232 and have a vertical edge 223 that extends in the Z-direction 236. The vertical edge 223 of the second central section 212-2 is opposite the first vertical edge 221a of the first base section 214-1 such that the vertical edges 221a, 223 define the longitudinal boundaries of the first electrode 206. Further, the first central section 212-1 may include a first edge 212a and a second edge 212b opposite the first edge 212a along the Z-direction 236. The first and second edges 212a, 212b each extend in the longitudinal direction 232 and intersect the second vertical edge 221b of the second base section 214-2 such that the edges 212a, 212b, 221b define the boundaries of the first electrode 106 in the first central section 212-1. The second central section 212-2 may include a third edge 212c and a fourth edge 212d opposite the third edge 212c along the Z-direction 236. The third and fourth edges 212c, 212d each extend in the longitudinal direction 232 and intersect the vertical edge 223 of the second central section 212-2 such that the edges 212c, 212d, 223 define the boundaries of the first electrode 106 in the second central section 212-2.

Each central section 212-1, 212-2 of the first electrode 206 may have a first width 227 extending, for example, in the Z-direction 236. In addition, each base section 214-1, 21402 of the first electrode 206 may have a second width 229, extending, for example, in the Z-direction 236. In this regard, the location of the first width 227 may be offset from the location of the second width 229 in the longitudinal direction 232 such that the location of the second width 229 is closer to the external termination to which the first electrode 206 is electrically connected. Such a configuration may allow for adjustment of an overlapping area between central sections 212 of adjacent electrodes in the lateral direction 234. Further, in at least some embodiments, the second width 229 of each base section 214-1, 214-2 may be greater than the first width 227 of each central section 212-1, 212-2.

In general, the internal electrode layers 202, 204 include at least one lead tab 2002a, 2004a extending along the Z-direction 236 from a top edge and a bottom edge of the first central section 212-1 and at least one lead tab 2002b, 2004b extending along the Z-direction 236 from a top edge and a bottom edge of the second central section 212-2. Generally, the lead tabs 2002a, 2004a, 2002b, 2004b of the electrode layers 202, 204 extend to the top surface and the bottom surface of the capacitor and assist in forming the external terminals 22a-b, 24a-b. In this regard, the lead tabs 2002a, 2004a, 2002b, 2004b may be exposed on the top surface 28a and the bottom surface 28b of the capacitor and allow for connection between the central sections 212-1, 212-2 of the internal electrode layers and the external terminals 22a-b, 24a-b. For instance, lead tabs 2002a, 2004a of electrode layers 202, 204 may be defined by the first base section 214-1 and include first and second leading edges 214a, 214b that extend to an edge of a dielectric layer and allow for formation of the external terminals 22a, 24a on the top surface 28a and bottom surface 28b. The lead tabs 2002b, 2004b of electrode layers 202, 204 may be defined by the second base section 214-2 and include third and fourth leading edges 214c, 214d that extend to an edge of a dielectric layer and allow for formation of the external terminals 22b, 24b on the top surface 28a and bottom surface 28b.

The lead tabs 2002a, 2004a, 2002b, 2004b generally may be configured as described with respect to the lead tabs 1002, 1004 of the capacitor 10 described above. For example, the length of the lead tabs 2002a, 2004a, 2002b, 2004b may vary as desired, but is typically from about 0.3 to about 1.2 mm, in some embodiments from about 0.4 to about 1.1 mm, and in some embodiments, from about 0.5 to about 1 mm. When more than one lead tab is present along an edge, each lead tab may have the same length. In another embodiment, each lead tab may have a different length. For instance, the lead tab substantially aligned with the side edge of the internal electrode layer may have a length greater than the lead tab offset from the side edges of the internal electrode layer. In this regard, the ratio of the length of the lead tab aligned with the side edge of the internal electrode layer to the length of the lead tab offset from the side edges of the internal electrode layer may from about 0.3 to about 5, in some embodiments from about 0.5 to about 4, and in some embodiments, from about 0.7 to about 3. By being substantially aligned, it is generally meant that the offset from a side edge of one lateral edge of a first lead tab and/or second lead tab on a top edge is within +/−10%, such as within +/−5%, such as within +/−4%, such as within +/−3%, such as within +/−2%, such as within +/−1%, such as within +/−0.5% of the offset from a side edge of a corresponding lateral edge of a first lead tab and/or second lead tab on a bottom edge.

The lead tabs 2002a, 2004a, 2002b, 2004b on the top edge and the bottom edge of internal electrode layers 202, 204 may be aligned in the vertical direction. For instance, as shown in FIG. 2B, a lateral edge of a first lead tab 2002a (extending along the Z-direction 136) may be aligned with a lateral edge of a second lead tab 2004a (extending along the Z-direction 136) opposite the first lead tab 2002a. In addition, such lateral edges of the lead tabs 2002a, 2004a may be aligned with a side edge 221a of the internal electrode layer 202. However, it should be understood that the lateral edges of the lead tabs 2002a, 2004a may be aligned with one another but offset from the side edge 221a. A third lead tab 2002b and a fourth lead tab 2004b may be aligned with one another as described with respect to the first lead tab 2002a and second lead tab 2004a.

The relationship between lateral edges of a first lead tab on a top edge and a second lead tab on a bottom edge as mentioned with respect to internal electrode layer 202 may also apply to internal electrode layer 204. With such arrangement, a gap may be formed between a first lead tab 2002a of the first internal electrode layer 202 and a third lead tab 2002b of the second internal electrode layer 204. Further, a gap may be formed between a third lead tab 2002b of the first internal electrode layer 202 and the third lead tab 2002b of the second internal electrode layer 204, and another gap may be formed between the third lead tab 2002b of the first internal electrode layer 202 and a first lead tab 2002a of the second internal electrode layer 204. Similarly, a first gap may be formed between a second lead tab 2004a of the first internal electrode layer 202 and a fourth lead tab 2004b of the second internal electrode layer 204, a second gap may be formed between a fourth lead tab of the first internal electrode layer 202 and the fourth lead tab 2004b of the second internal electrode layer 204, and a third gap may be formed between the fourth lead tab 2004b of the first internal electrode layer 202 and a second lead tab 2004a of the second internal electrode layer 204. The size of each respective gap may be substantially the same, or the size of at least one gap may be different from another gap. For example, the size of the gap between the first lead tab 2002a of the first internal electrode layer 202 and the third lead tab 2002b of the second internal electrode layer 204 may be different from the size of the gap between the third lead tab 2004a of the first internal electrode layer 202 and the third lead tab 2004a of the second internal electrode layer 204.

For a given electrode layer 202, 204, the lead tabs 2002a may be arranged in parallel with lead tabs 2004a and the lead tabs 2002b may be arranged in parallel with lead tabs 2004b such that the lead tabs extending from alternating electrode layers 202 and 204 may be aligned in respective columns. For instance, lead tabs 2002a, 2004a of internal electrode layers 202 may be arranged in a respective stacked configuration while lead tabs 2002a, 2004a of internal electrode layers 204 may be arranged in a respective stacked configuration. Similarly, lead tabs 2002b, 2004b of internal electrode layers 202 may be arranged in a respective stacked configuration while lead tabs 2002b, 2004b of internal electrode layers 204 may be arranged in a respective stacked configuration. As such, for the embodiment depicted in FIG. 2B, the stacked electrode layers 202, 204 may form four respective columns of lead tabs.

It will be appreciated that lead tabs 2002a, 2004a of electrode layers 202 connect to external termination 22a while lead tabs 2002a, 2004a of electrode layers 204 connect to external termination 24a. Further, lead tabs 2002b, 2004b of electrode layers 202 connect to external termination 22b while lead tabs 2002b, 2004b of electrode layers 204 connect to external termination 24b. Accordingly, respective lead tabs 2002a, 2004a, 2002b, 2004b of electrode layers 202 will be interdigitated with respective lead tabs 2002a, 2004a, 2002b, 2004b of electrode layers 204 in a manner similar to external terminations 22a, 22b, 24a, 24b. The interdigitated lead tabs can provide multiple, adjacent current injection points onto the associated main electrode portions.

The distance between adjacent exposed lead tabs of the internal electrode layers in a given column may be specifically designed to help ensure guided formation of terminations. The distance between exposed lead tabs of the internal electrode layers in a given column may, for example, range from about 0.25 to about 10 μm, in some embodiments from about 0.5 to about 5 μm, and in some embodiments, from about 1 to about 4 μm. Additionally, the distance between adjacent columnar stacks of electrode tabs may be, while not limited, greater by at least a factor of two than the distance between adjacent lead tabs in a given column to ensure that distinct terminations do not run together. In some embodiments, the distance between adjacent columnar stacks of exposed metallization may be about four times (4×) the distance between adjacent exposed electrode tabs in a particular stack. However, such distance may vary depending on the desired capacitance performance and circuit board configuration. For example, the distance may be from about 0.1 to about 1.5 mm, in some embodiments from about 0.2 to about 1.3 mm, and in some embodiments, from about 0.3 to about 1 mm, as determined based on the center-point of each lead tab or based on the distance between adjacent lateral edges of the lead tabs. In addition, such distance may correspond to the separation distance of the ball on a ball grid array.

Referring still to FIG. 2B, the first electrode 206 may have a first connecting section 216-1 and a second connecting section 216-2. The first connecting section 216-1 may extend from the first base section 214-1 in the longitudinal direction 232. In particular, the first connecting section 216-1 may extend between and connect the first base section 214-1 and the first central section 212-1. Similarly, the second connecting section 216-2 may extend from the second base section 214-2 in the longitudinal direction 232. In particular, the second connecting section 216-2 may extend between and connect the second base section 214-2 and the second central section 212-2.

As shown in the embodiment of FIG. 2B, a first connecting edge 216a of the first connecting section 216-1 extends from the first leading edge 214a of the first base section 214-1 to the first edge 212a of the first central section 212-1, and a second connecting edge 216b of the first connecting section 216-1 extends from the second leading edge 214b of the first base section 214-1 to the second edge 212b of the first central section 212-1. Thus, the first connecting edge 216a intersects the first leading edge 214a and the first edge 212a to connect the first base section 214-1 to the first central section 212-1 along one longitudinal side of the first electrode 206. The second connecting edge 216b intersects the second leading edge 214b and the second edge 212b to connect the first base section 214-1 to the first central section 212-1 along the other, opposite longitudinal side of the first electrode 206.

Further, a third connecting edge 216c of the second connecting section 216-2 extends from the third leading edge 214c of the second base section 214-2 to the third edge 212c of the second central section 212-2, and a fourth connecting edge 216b of the second connecting section 216-2 extends from the fourth leading edge 214d of the second base section 214-2 to the fourth edge 212d of the second central section 212-2. Thus, the third connecting edge 216c intersects the third leading edge 214c and the third edge 212c to connect the second base section 214-2 to the second central section 212-2 along one longitudinal side of the first electrode 206. The fourth connecting edge 216d intersects the fourth leading edge 214d and the fourth edge 212d to connect the second base section 214-2 to the second central section 212-2 along the other, opposite longitudinal side of the first electrode 206.

Each connecting section 216-1, 216-2 may have a third width 231 extending, for example, in the Z-direction 236. In this regard, the location of the third width 231 may be offset from the location of the respective first width 227 and the location of the respective second width 229 in the longitudinal direction 232. In one embodiment, the third width 231 of the respective connecting section 216-1, 216-2 may be less than the second width 229 of the respective base section 214-1, 214-2. Also, the third width 231 of the respective connecting section 216-1, 216-2 may be greater than the first width 227 of the respective central section 212-1, 212-2. In this regard, the location of the third width 231 may be between the location of the first width 227 and the location of the second width 229 for each respective Y-shaped portion of the first electrode 206.

Moreover, the third width 231 may vary within the connecting section 216-1, 216-2. For example, the third width 231 may have a first value at one location within the respective connecting section 216-1, 216-2 and a second, different value at another location within the respective connecting section 216-1, 216-2, where the two locations within the respective connecting section 216-1, 216-2 are spaced apart from one another along the longitudinal direction 232.

At least a portion of at least one of the first connecting edge 216a, second connecting edge 216b, third connecting edge 216c, or fourth connecting edge 216d is not perpendicular to the respective edge 212a, 212b, 212c, 212d of the central section the respective connecting edge 216a, 216b, 216c, 216d intersects. For instance, in one embodiment, the first connecting edge 216a of the first connecting section 216-1 may form a first angle 241 with the first edge 212a of the first central section 212-1. Similarly, the third edge 212c of the second central section 212-2 may form a first angle 241 with the third connecting edge 216c of the second connecting section 216-2. Such angle 241 may be greater than 90° and less than 180°. For instance, such angle 241 may be within the ranges described above for the angle 141. Without intending to be limited by theory, such configuration may provide for a generally Y-shaped electrode configuration from the first base section 214-1 through the first central section 212-1 and from the second base section 214-4 through the second central section 212-2, such that the depicted embodiment includes multiple Y-shapes.

Further, in the depicted embodiment of FIG. 2B, a second angle 247 is formed between the second edge 212b and the second connecting edge 216b, with the second angle 247 being greater than 90° and less than 180° as described above with respect to the first angle 241. A second angle 247 is also formed between the fourth edge 212d and the fourth connecting edge 216d, with the second angle 247 being greater than 90° and less than 180° as described above with respect to the first angle 241. Thus, it will be appreciated that the second Y-shape of the first electrode 206 shown in FIG. 2B is configured similarly to the first Y-shape of the first electrode 206. For example, the first base section 214-1, first connecting section 216-1, and first central section 212-1 of the first electrode 206 define a first Y-shape, and the second base section 214-2, second connecting section 216-2, and second central section 212-2 of the first electrode 206 define a second Y-shape. The first and second Y-shapes of the first electrode may be generally similar to one another or the Y-shapes may be different from one another, e.g., the first angle 241 of one Y-shape of the first electrode 206 may have a different value than the first angle 241 of the other Y-shape of the first electrode 206.

Further, for the first electrode 206 shown in FIG. 2B, at least a portion of the first connecting edge 216a is not perpendicular to the first edge 212a and at least a portion of the second connecting edge 216b is not perpendicular to the second edge 212b. Moreover, at least a portion of the third connecting edge 216c is not perpendicular to the third edge 212c and at least a portion of the fourth connecting edge 216d is not perpendicular to the fourth edge 212d. It will also be appreciated that, for the depicted embodiment, at least a portion of the first connecting edge 216a is not perpendicular to the first leading edge 214a, at least a portion of the second connecting edge 216b is not perpendicular to the second leading edge 214b, at least a portion of the third connecting edge 216c is not perpendicular to the third leading edge 214c, and at least a portion of the fourth connecting edge 216d is not perpendicular to the fourth leading edge 214d.

FIG. 2C illustrates electrode layers 202, 204 in which at least one of the first electrode 206 or second electrode 208 has at least a portion of at least one edge that is not perpendicular to an intersecting edge in accordance with aspects of the present disclosure. For instance, at least one of the first electrode 206 or second electrode 208 includes a rounded corner, which rounded edge of the rounded corner is not perpendicular to an intersecting edge. As described with respect to FIG. 1G, "rounded" may refer to a perimeter having the shape of a circular or elliptical arc and may also refer to any suitable edge that is not precisely circular or elliptical but is otherwise curved or arcuate. Additionally, in some embodiments, a perimeter of the first electrode 206 and/or second electrode 208 may be free of geometric discontinuities, e.g., as described above with respect to the embodiment of FIG. 1G. Rounded corner configurations may reduce electric field and charge concentrations in the corners and/or along the edges of the electrodes 206, 208 adjacent the corners, which may increase the breakdown voltage of a capacitor incorporating the electrode layers 202, 204 compared with conventional electrode configurations.

The electrode layers 202, 204 may be configured similarly to the electrode layers 202, 204 described with respect to FIG. 2B but having curved or rounded connecting edges 216a, 216b, 216c, 216d of the respective connecting sections 216-1, 216-2 rather than linear connecting edges 216a, 216b, 216c, 216d as shown in FIG. 2B. For instance, as shown in FIG. 2C, the first connecting edge 216a defines a first rounded corner having a first radius $r_1$, the second connecting edge 216b defines a second rounded corner having a second radius $r_2$, the third connecting edge 216c defines a third rounded corner having a third radius $r_3$, and the fourth connecting edge 216d defines a fourth rounded corner having a fourth radius $r_4$. Thus, at least a portion of the connecting edges 216a, 216b, 216c, 216d is not perpendicular to the respective edge 212a, 212b, 212c, 212d intersected by the respective connecting edge.

Further, in the embodiment of FIG. 2C, the first electrode 206 defines additional rounded corners, and the second electrode 208 also includes rounded corners. For example, the first electrode 206 defines a fifth rounded corner and a sixth rounded corner between the first central section 212-1 and the second base section 214-2, the rounded corners having radii $r_5$ and $r_6$, respectively. The second electrode 208 defines a seventh rounded corner having a radius $r_7$ and an eighth rounded corner having a radius $r_8$, with the seventh and eighth rounded corners being defined at the intersections of edges of the second electrode 208 that are closest to the first electrode 206.

It will be appreciated that the radii of the various rounded corners in the electrode layers 202, 204 may be the same or at least one radius may be different from the others. For instance, as shown in FIG. 2C, the seventh radius $r_7$ and the eighth radius $r_6$ of the second electrode 208 may be equal to one another but not equal to any of the first radius $r_1$, second radius $r_2$, third radius $r_3$, fourth radius $r_4$, fifth radius $r_5$, and/or sixth radius $r_6$ of the first electrode 206 (which may be equal to one another but different from the seventh and eight radii $r_7$, $r_8$).

As further shown in FIG. 2C, a central end gap distance 233 may be formed in the longitudinal direction 232 between a longitudinal end of the second central section 212-2 of the first electrode 206 and a longitudinal end of the base section 214 of the second electrode 208. Accordingly, in one embodiment, a ratio of the central end gap distance 233 to a capacitor length 25 (FIG. 2A) may be 0.01 or more, such as 0.05 or more, such as 0.1 or more, such as 0.2 or more, such as 0.3 or more, such as 0.4 or more. The ratio may be such as 0.5 or less, such as 0.4 or less, such as 0.3 or less, such as 0.2 or less, such as 0.1 or less.

Other variations and/or combinations are possible within the scope of this disclosure. For example, the first electrodes 206 may have a generally Y-shaped configurations as well as one or more curved or rounded connecting edges 216a, 216b, 216c, 216d. A different number and/or configuration of connecting edges that are not perpendicular to an edge of the respective central section may be used in electrodes 206, 208 on various electrode layers 202, 204, i.e., one or more electrode layers 202, 204 may have an electrode 206, 208 with a different connecting edge configuration than at least one other electrode layer 202, 204.

As further shown in FIGS. 2B and 2C, each leading edge 214a, 214b, 214c, 214d of the base sections 214-1, 214-2 of first electrode 206 may also have a certain length 235 extending in the longitudinal direction 232. In general, such length 235 of the respective base section may be defined as the distance between the vertical edge 221a, 221b and the point of transition between the respective base section 214-1, 214-2 and the respective connecting section 216-1, 216-2. For instance, the leading edges 214a, 214b, 214c, 214d each may generally have a slope of 0° and the point at which the slope changes may be considered the aforementioned point of transition. Regardless, such length 235 may be 0.05 or more, such as 0.1 or more, such as 0.15 or more, such as 0.2 or more, such as 0.3 or more the capacitor length 25 (FIG. 2A) as defined herein. Such length 235 may be 0.5 or less, such as 0.4 or less, such as 0.3 or less, such as 0.25 or less, such as 0.2 or less, such as 0.15 or less the capacitor length 25.

As also illustrated in FIG. 2C, the base section 214 of second electrode 208 may also have a certain length 245 extending in the longitudinal direction 232. Such length may be 0.05 or more, such as 0.1 or more, such as 0.15 or more, such as 0.2 or more, such as 0.3 or more the capacitor length 25. Such length 245 may be 0.5 or less, such as 0.4 or less, such as 0.3 or less, such as 0.25 or less, such as 0.2 or less, such as 0.15 or less the capacitor length 25.

In one embodiment, the aforementioned lengths 235 and 245 may be different. In one particular embodiment, the aforementioned lengths 235 and 245 may be substantially the same. Moreover, the length 235 of the first base section 214-1 may be the same as or different from the length 235 of the second base section 214-2.

Further, referring to FIG. 2A, the first end external termination 22a may have a first lateral edge 222. The first lateral edge 222 may extend in a Z-direction 236 and/or a lateral direction 234. The first lateral edge 222 of the first external termination 22a may substantially align with a vertical edge 230 (FIGS. 2B, 2C) of the first base section 214-1 of first electrode 206 in the longitudinal direction. Such vertical edge 230 may be at a location wherein the first base section 214-1 ends and the first connecting section 216-1 begins. For instance, the first lateral edge 222 of the first end external termination 22a may be within 5%, such as within 4%, such as within 3%, such as within 2%, such as within 1%, such as within 0.8%, such as within 0.6%, such as within 0.5%, such as within 0.4%, such as within 0.3%, such as within 0.2%, such as within 0.1% of the vertical edge 230 of the first base section 214-1 of first electrode 206 in the longitudinal direction based on the length 235 of the first base section 214-1 of first electrode 206.

Similarly, the second end external termination 24a may have a second lateral edge 224 (FIG. 2A). The second lateral edge 224 may extend in a Z-direction 236 and/or a lateral direction 234. The second lateral edge 224 of the second external termination 24a may substantially align with a vertical edge 230 of the first base section 214-1 of first electrode 206 in the longitudinal direction. Such lateral edge 224 may be at a location wherein the first base section 214-1 ends and the first connecting section 216-1 begins. For instance, the second lateral edge 224 of the second end external termination 24a may be within 5%, such as within 4%, such as within 3%, such as within 2%, such as within 1%, such as within 0.8%, such as within 0.6%, such as within 0.5%, such as within 0.4%, such as within 0.3%, such as within 0.2%, such as within 0.1% of the vertical edge 230 of the first base section 214-1 of first electrode 206 in the longitudinal direction based on the length 235 of the first base section 214-1 of first electrode 206.

It will be appreciated that the first lateral edge 222 of first end external termination 22a may align with the vertical edge 230 of the first electrodes 206 of electrode layers 202 or electrode layers 204, while the second lateral edge 224 of second end external termination 24a may align with the vertical edge 230 of first electrodes 206 the other of electrode layers 202 or electrode layers 204.

In addition, the first lateral edge 222 of the first end external termination 22a may substantially align with a lateral edge 226 (FIG. 2C) of the base section 214 of second electrode 208 of electrode layers 202, while the second lateral edge 224 of the second end external termination 24a may substantially align with a lateral edge (not shown) of the base section 214 of second electrode 208 of electrode layers 204. For instance, each lateral edge 222, 224 of the respective end external termination 22a, 24a may be within 5%, such as within 4%, such as within 3%, such as within 2%, such as within 1%, such as within 0.8%, such as within 0.6%, such as within 0.5%, such as within 0.4%, such as within 0.3%, such as within 0.2%, such as within 0.1% of the respective lateral edge of the base section 214 of second electrode 208 in the longitudinal direction based on the length 245 of the base section 214 of second electrode 208.

As indicated herein, the dielectric layers and electrode layers of the capacitor 20 may be stacked to form a set of alternating layers. For instance, the electrode layers may interleaved in an opposed and spaced apart relation with a dielectric layer located between each electrode layer, and any number of dielectric layers and electrode layers as described herein may be included in a respective stack. Further, as described elsewhere herein, one, two, three, four, or more sets of stacked, alternating dielectric and electrode layers may be disposed within a single capacitor body. The capacitor 20 includes one single set of dielectric and electrode layers to form the body 26 of the capacitor 20, but a capacitor body may include additional sets of stacked layers, e.g., as described with respect to FIGS. 3A-5B.

Referring now to FIGS. 3A-7, for embodiments including multiple stacks of alternating dielectric and electrode layers disposed within a single capacitor body, each set of alternating dielectric layers and internal electrode layers defines a capacitive element. Each set of alternating dielectric layers and electrode layers comprises dielectric layers alternately arranged with electrode layers. In particular, the electrode layers include first electrode layers and second electrode layers interleaved in an opposed and spaced apart relation with a dielectric layer located between each electrode layer. In at least some embodiments, the first electrode layers and second electrode layers may be configured as described above with respect to the first and second electrode layers 102, 104 of capacitor 10 and/or the first and second electrode layers 202, 204 of capacitor 20. For example, each capacitive element within a single capacitor body can include a stack of first and second electrode layers 102, 104 or first and second electrode layers 202, 204.

The particular arrangement of the capacitive elements within a single, unitary package (i.e., single body) can provide several advantages. For instance, such a capacitor may be mounted onto a circuit board as a surface mount capacitor and may provide a smaller footprint on the circuit board. This may in turn also allow for a reduction in size of a circuit board.

One distinct advantage of capacitors and configurations utilizing multiple capacitive elements in a single body in comparison to employing a plurality of individual multilayer ceramic capacitors is regarding a direct power ground connection. As illustrated in FIG. 6, such a capacitor 608 (having multiple capacitive elements within a single body) can be mounted (e.g., surface mounted) onto a circuit board 606 that contains a substrate (e.g., insulating layer) having an upper surface and a lower surface. The circuit board 606 has a plurality of electrical current paths (not shown) defined therein. The external terminations of the capacitor 608 are in respective electrical communication with the predetermined current paths of the circuit board 606. In addition, the external terminations of the capacitor 608 can be physically connected to the circuit board 606 using any method generally known in the art, such as general soldering techniques.

As illustrated in FIG. 6, an integrated circuit package 602 may also be provided on the circuit board 606. The integrated circuit package 602 may be connected to the circuit board 606 using a ball grid array 604. The circuit board may further comprise a processor 600. The processor 600 may be connected to the integrated circuit package 602 also using a ball grid array 612.

In general, the ball grid array 604 may be configured such that the pitch is 1.5 mm or less, such as 1.25 mm or less, such as 1 mm or less, such as 0.8 mm or less, such as 0.6 mm or less and 0.4 mm or more, such as 0.5 mm or more, such as 0.6 mm or more.

In addition, the integrated circuit package 602 may also be connected to the circuit board 606 using the capacitor 608 as defined herein. In this regard, the internal electrode layers of the capacitor 608 may be positioned such that they are orthogonal to a horizontal plane of the circuit board 606 and integrated circuit package 602. In other words, the internal electrode layers of the capacitor 608 may be positioned such that they are substantially nonparallel with the circuit board 606. For instance, the capacitor 608 may be positioned between the integrated circuit package 602 and the circuit board 606 such that the capacitor 608 is "sandwiched" between the two components. In this regard, the capacitor 608 is directly connected to the integrated circuit package 602 and the circuit board 606. For instance, the capacitor 608 can be connected (e.g., physically and/or electrically) to the circuit board 606 and/or circuit package 602 using any method generally known in the art, such as general soldering techniques.

By employing the capacitor in the aforementioned arrangement, the capacitor 608 may allow for removal of some of the original ball grid array 604. However, the capacitor 608 may still be surrounded by a ball grid array 604 as illustrated in FIG. 6.

Thus, as shown in FIG. 6, the capacitor 608 of the present invention can be directly connected to an integrated circuit package 602 and a circuit board 606, such as a printed circuit board. This direct connection allows for current 610 to flow through the capacitor thereby providing a direct power ground connection.

Meanwhile, a prior art circuit board 706 is illustrated in FIG. 7. The circuit board 706 includes a processor 700, an integrated circuit package 702, and ball grid arrays 704 and 712. However, rather than employing a single, unitary capacitor package like capacitor 608 in FIG. 6, the circuit board 706 of FIG. 7 employs a plurality of individual multilayer ceramic capacitors 708.

The present configuration employing a single, unitary capacitor can allow for various advantages and benefits in comparison to a circuit board that employs a plurality of individual multilayer ceramic capacitors. One distinct advantage of the capacitors and configuration of the present invention in comparison to employing a plurality of individual multilayer ceramic capacitors is regarding the direct power ground connection, as shown in FIG. 6 where the capacitor of the present invention is directly connected to the integrated circuit package 602 and circuit board 606. When multiple, individual capacitors are provided as in the prior art as in FIG. 7, certain multilayer capacitors 708 are unable to make a direct connection to the circuit board 706 and the integrated circuit package 702 for various reasons, including minor differences in height. Because of such issues with uniformity, employing multiple, individual multilayer capacitors to make a connection can be difficult. As a result, as illustrated in FIG. 7, two current paths exist: (1) current 714 between the processor 700 and the individual capacitors 708 and (2) current 716 between the processor 700 and the circuit board 716. With such configuration, a direct power ground connection cannot be obtained.

In addition to the above, although not illustrated herein, in one embodiment, the integrated circuit package itself may include the multilayer capacitor. In this regard, the capacitor may be embedded directly into the package. Such incorporation of the capacitor may allow for a reduction in size, which can be beneficial for various electronic applications.

Figure 3A:
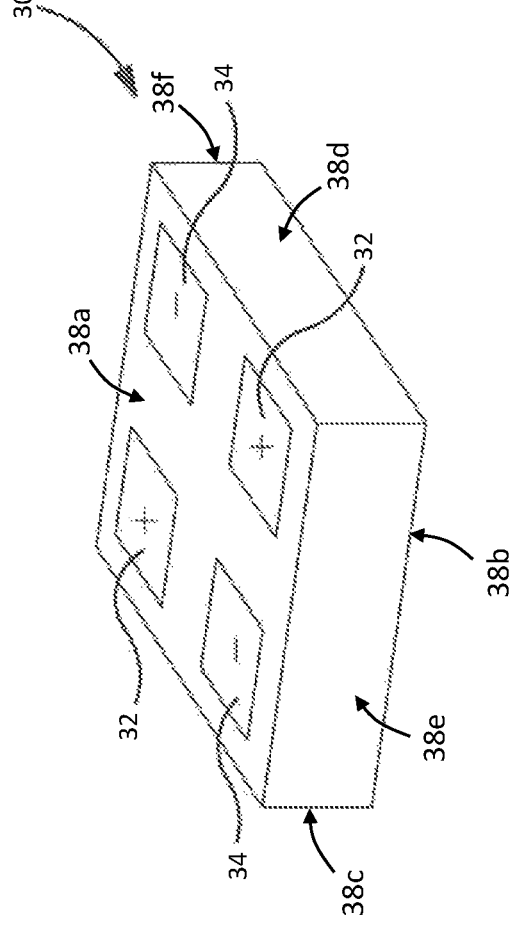
FIG. 3A illustrates a generally top and sides external perspective view of one embodiment of a 2 by 2 package capacitor in accordance with the present invention.

Referring now to FIGS. 3A-5B, various embodiments of capacitors having multiple capacitive elements will be described. FIG. 3A and FIG. 3B each illustrate a capacitor 30 in a 2 by 2 configuration. That is, the capacitor 30 includes two terminations along each dimension of a top surface 38a and a bottom surface 38b. In this regard, the capacitor 30 includes a total of four external terminations 32, 34 on a top surface and four corresponding external terminations (not shown) on a bottom surface wherein the external terminations on the top surface are electrically connected to the corresponding external terminations on the bottom surface. In the embodiment of FIG. 3A, the external terminations 32, 34 are spaced apart from both end surfaces 38c, 38d and side surfaces 38e, 38f of the capacitor 38. In the embodiment of FIG. 3B, the external terminations 32, 34 are spaced apart from the side surfaces 38e, 38f of the capacitor 38 but extend along the end surfaces 38c, 38d.

Figure 3B:
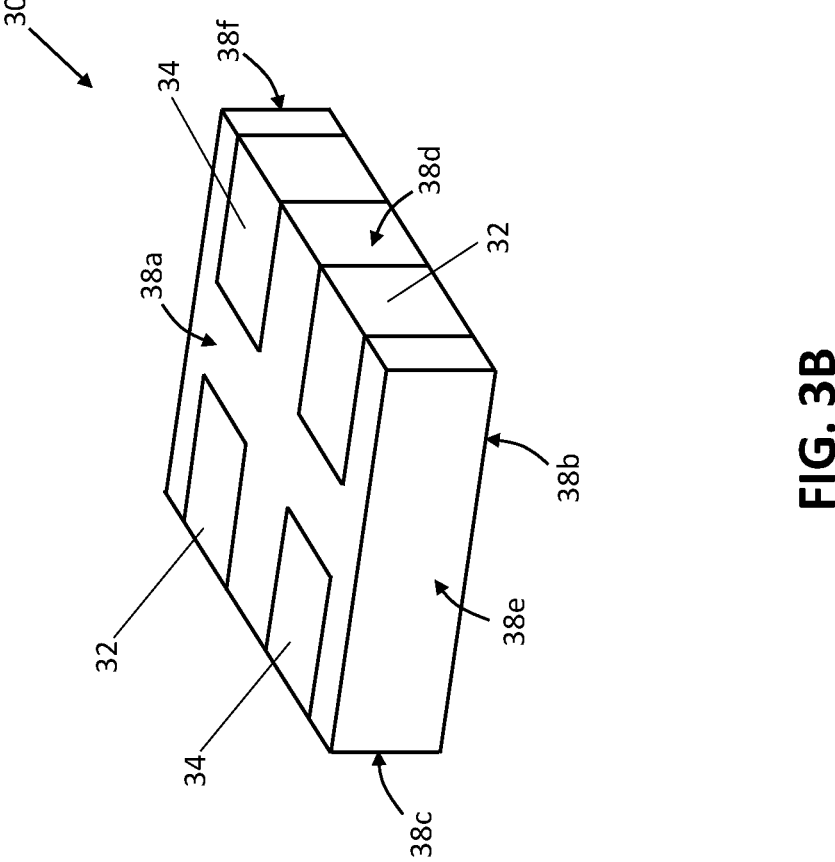
FIG. 3B illustrates a generally top and sides external perspective view of another embodiment of a 2 by 2 package capacitor in accordance with the present invention.
Figure 3C:
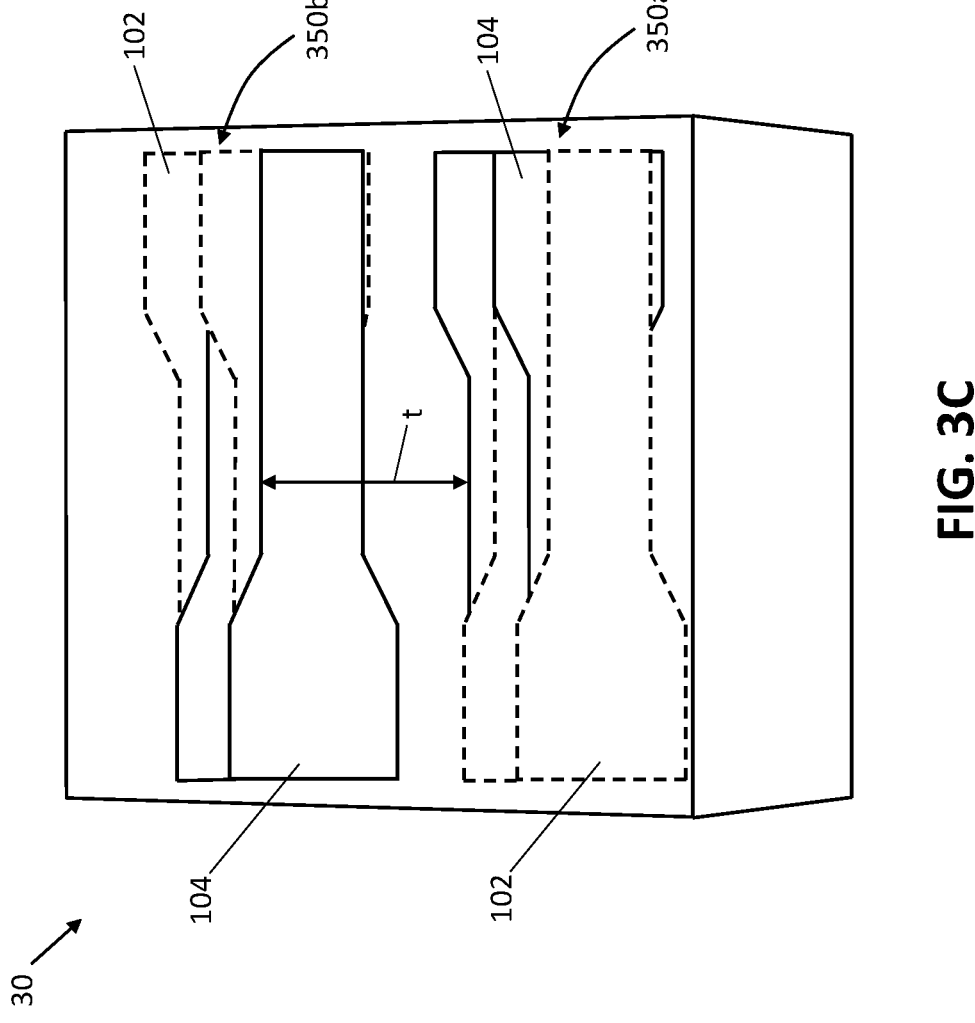
FIG. 3C illustrates a top and side perspective view of the capacitor of FIG. 3A including the sets of alternating dielectric layers and internal electrode layers of FIG. 1F.

The capacitor 30 of FIGS. 3A and 3B includes two sets 350 of alternating dielectric layers and internal electrode layers, as illustrated in FIG. 3C. Each set 350 of alternating dielectric layers and internal electrode layers includes internal electrode layers 102, 104 and dielectric layers (not shown) in an alternate arrangement. The sets 350 of alternating dielectric layers and internal electrode layers are spaced apart from one another by a spacing distance t. For example, the spacing distance t may be defined between a first set 350a and a second set 350b of alternating dielectric layers and internal electrode layers.

The spacing distance t between the sets may be from about 0.2 to about 10 μm, in some embodiments from about 0.5 to about 8 μm, and in some embodiments from about 1 to about 5 μm. Additionally, the spacing distance t may be, while not limited, is at least 2 times, in some embodiments at least about 3 times, and in embodiments, from about 4 to about 8 times greater than the distance between adjacent lead tabs in a given column to ensure that distinct terminations do not run together.

In general, the electrode layers 102, 104 are configured as described with respect to FIG. 1F. However, the electrode layers 102, 104 also may be configured as described with respect to other embodiments of the capacitor 10. For example, where the external terminations 32, 34 extend along the ends 38c, 38d of the capacitor 30 (as well as the top surface 38a and bottom surface 38b), the internal electrode layers 102, 104 may be configured similarly to FIG. 1C, 1D, or 1G, having second electrodes 108 to assist in the formation of the external terminations 32, 34, particularly along the end surfaces 38c, 38d. Further, it will be appreciated that, for embodiments of the capacitor 30 such as shown in FIG. 3A, the base section 114 of electrode layers 102, 104 may be spaced apart from the end surfaces 38c, 38d of the capacitor 30, e.g., dielectric material may be disposed along the leading edge (extending along the Z-direction) of the base section 114 to define the entirety of the end surfaces 38c, 38d of the capacitor 30.

As illustrated in FIGS. 3A-3C, the capacitor 30 contains four external terminations on each surface. However, as indicated above, the present invention is not limited by the number of external terminations.

Figure 4A:
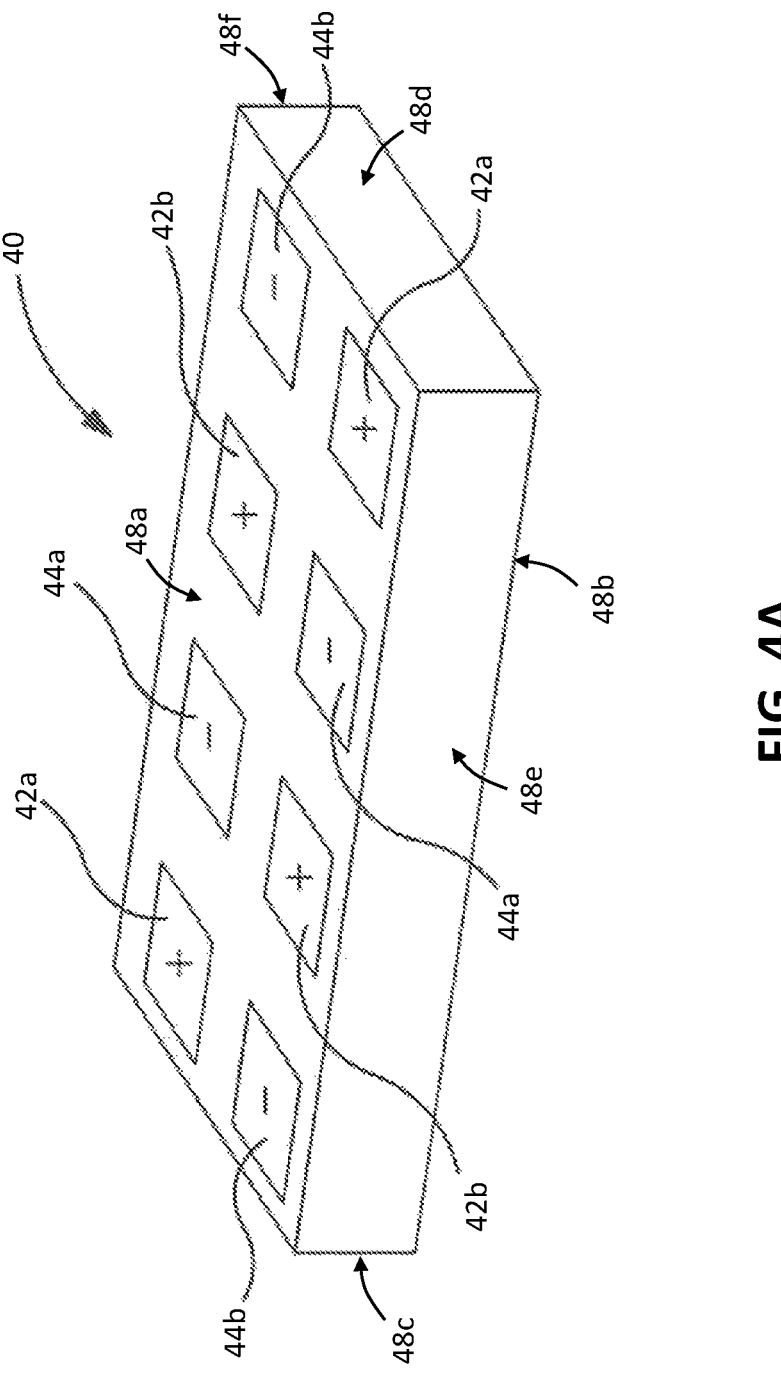
FIG. 4A illustrates a generally top and sides external perspective view of one embodiment of a 2 by 4 package capacitor in accordance with the present invention.

For instance, FIG. 4A illustrates a capacitor 40 having a 2 by 4 configuration. That is, the capacitor 40 includes two terminations along one dimension and four terminations along another dimension of a top surface 48*a* and a bottom surface 48*b*. In this regard, the capacitor 40 includes a total of eight external terminations 42*a*, 42*b*, 44*a*, 44*b* on the top surface 48*a* and eight corresponding external terminations (not shown) on the bottom surface 48*b* wherein the external terminations on the top surface 48*a* are electrically connected to the corresponding external terminations 42*a*, 42*b*, 44*a*, 44*b* on the bottom surface 48*b*.

Although not illustrated in the figures, it will be appreciated that the capacitor 40 also can be configured to have end external terminations 42*a*, 44*b* extending along the end surfaces 48*c*, 48*d*. That is, like the capacitor 30 shown in FIG. 3B, the external terminations 42*a*, 44*b* adjacent the end surfaces 48*c*, 48*d* can extend along the end surfaces 48*c*, 48*d* as well as the top and bottom surfaces 48*a*, 48*b*. In such embodiments, the leading edge (extending along the Z-direction) of the first base sections 214-1 is disposed at the end surfaces 48*c*, 48*d* (rather than being spaced apart from the end surfaces 48*c*, 48*d*) such that the first base sections 214-1 along their leading edges can assist in the formation of the external terminations along the end surfaces 48*c*, 48*d*.

Figure 4B:
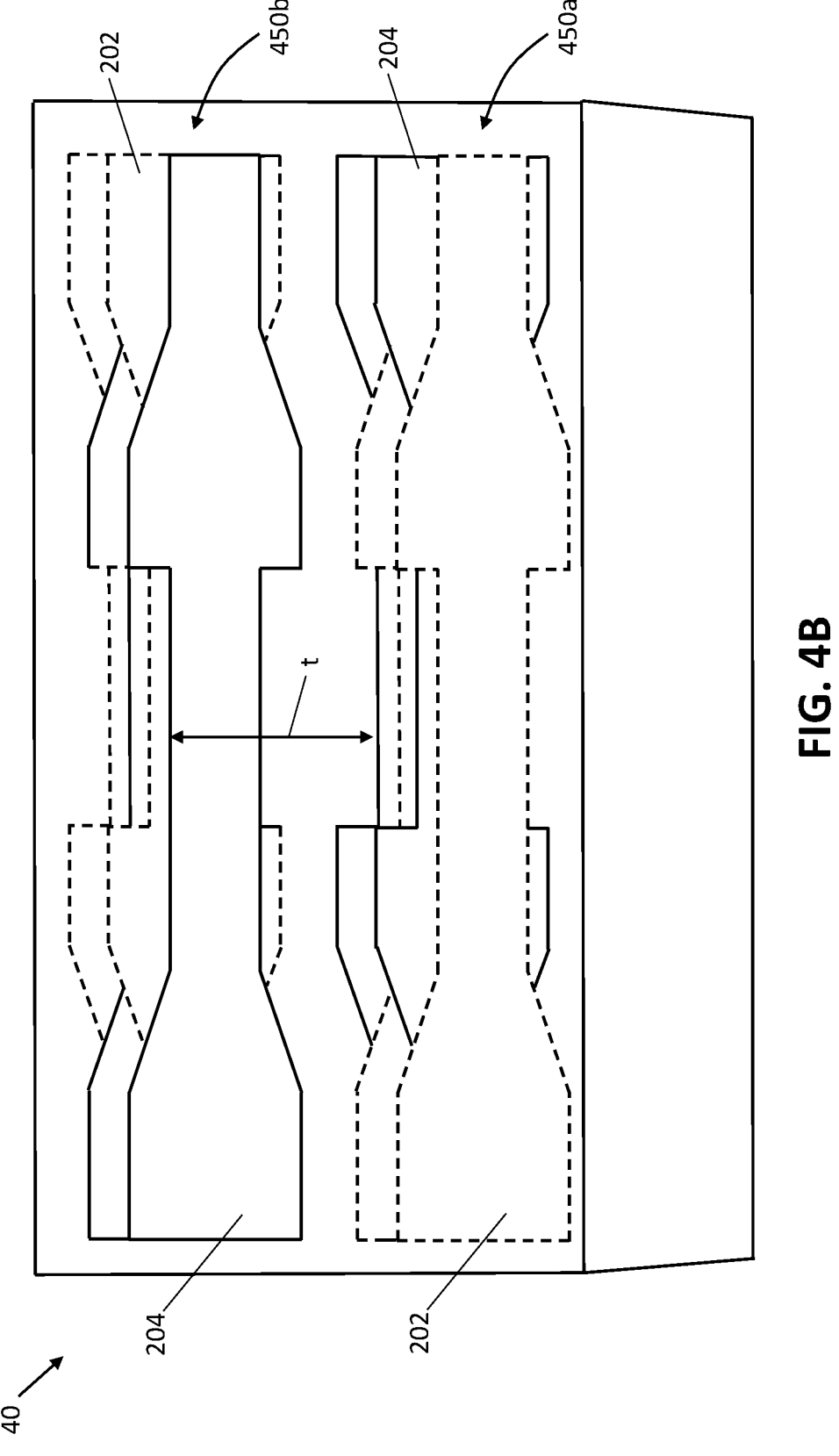
FIG. 4B illustrates a top and side perspective view of the capacitor of FIG. 4A including the sets of alternating dielectric layers and internal electrode layers of FIG. 2C.

The capacitor 40 of FIG. 4A includes two sets 450 of alternating dielectric layers and internal electrode layers, as illustrated in FIG. 4B. Each set 450 of alternating dielectric layers and internal electrode layers includes internal electrode layers 202, 204 and dielectric layers (not shown) in an alternate arrangement. The sets 450 of alternating dielectric layers and internal electrode layers are spaced apart from one another by a spacing distance t. For instance, the spacing distance t may be defined between a first set 450*a* and a second set 450*b* of alternating dielectric layers and internal electrode layers.

The spacing distance t between the sets may be from about 0.2 to about 10 μm, in some embodiments from about 0.5 to about 8 μm, and in some embodiments from about 1 to about 5 μm. Additionally, the spacing distance t may be, while not limited, is at least 2 times, in some embodiments at least about 3 times, and in embodiments, from about 4 to about 8 times greater than the distance between adjacent lead tabs in a given column to ensure that distinct terminations do not run together.

In general, the electrode layers 202, 204 are configured as described with respect to FIG. 2B. However, the electrode layers 202, 204 also may be configured as described with respect to other embodiments of the capacitor 20. For example, where the external terminations 42*a*, 44*b* extend to along the ends 48*c*, 48*d* of the capacitor 40 (as well as the top surface 48*a* and bottom surface 48*b*), the internal electrode layers 202, 204 may be configured similarly to FIG. 2C, having second electrodes 208 to assist in the formation of the external terminations 42*a*, 44*b*, particularly along the end surfaces 48*c*, 48*d*. Further, it will be appreciated that, for embodiments of the capacitor 40 such as shown in FIG. 4A, the first base section 214-1 of electrode layers 202, 204 may be spaced apart from the end surfaces 48*c*, 48*d* of the capacitor 40, e.g., dielectric material may be disposed along the leading edge (extending along the Z-direction) of the first base section 214-1 to define the entirety of the end surfaces 48*c*, 48*d* of the capacitor 40.

Figure 5A:
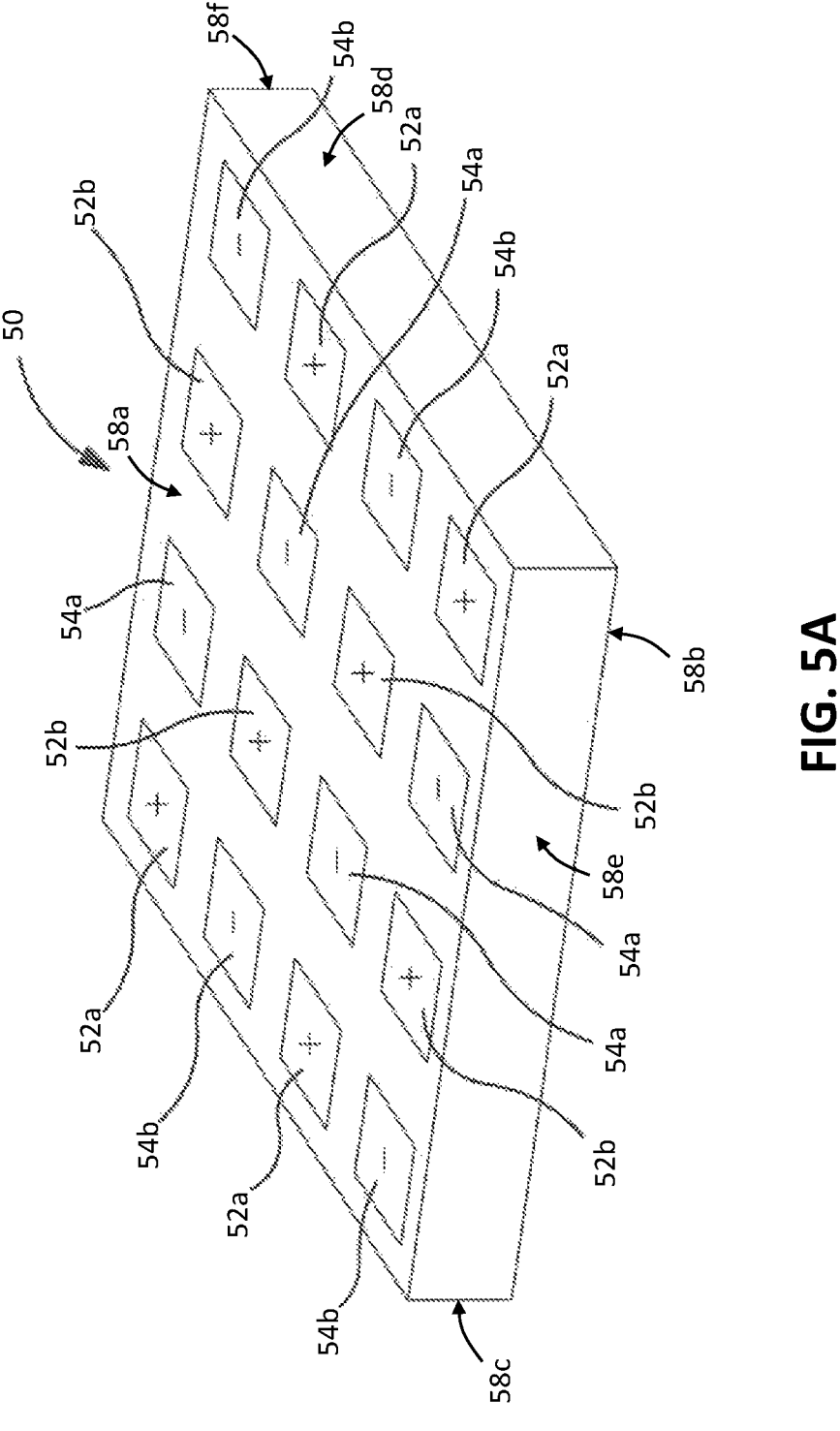
FIG. 5A illustrates a generally top and sides external perspective view of one embodiment of a 4 by 4 package capacitor in accordance with the present invention.

As another example of a different number of external terminations, FIG. 5A illustrates a capacitor 50 having a 4 by 4 configuration. That is, the capacitor 50 includes four terminations along one dimension and four terminations along another dimension of a top surface 58*a* and a bottom surface 58*b*. In this regard, the capacitor 50 includes a total of sixteen external terminations 52*a*, 52*b*, 54*a*, 54*b* on the top surface 58*a* and sixteen corresponding external terminations (not shown) on the bottom surface 58*b* wherein the external terminations on the top surface 58*a* are electrically connected to the corresponding external terminations 52*a*, 52*b*, 54*a*, 54*b* on the bottom surface 58*b*.

Although not illustrated in the figures, it will be appreciated that the capacitor 50 also can be configured to have end external terminations 52*a*, 54*b* extending along the end surfaces 58*c*, 58*d*. That is, like the capacitor 50 shown in FIG. 3B, the external terminations 52*a*, 54*b* adjacent the end surfaces 58*c*, 58*d* can extend along the end surfaces 58*c*, 58*d* as well as the top and bottom surfaces 58*a*, 58*b*. In such embodiments, the leading edge (extending along the Z-direction) of the first base sections 214-1 is disposed at the end surfaces 58*c*, 58*d* (rather than being spaced apart from the end surfaces 58*c*, 58*d*) such that the first base sections 214-1 along their leading edges can assist in the formation of the external terminations along the end surfaces 58*c*, 58*d*.

Figure 5B:
FIG. 5B illustrates a top and side perspective view of the capacitor of FIG. 5A including the sets of alternating dielectric layers and internal electrode layers of FIG. 2C.

The capacitor 50 of FIG. 5A includes four sets 550 of alternating dielectric layers and internal electrode layers, as illustrated in FIG. 5B. Each set 550 of alternating dielectric layers and internal electrode layers includes internal electrode layers 202, 204 and dielectric layers (not shown) in an alternate arrangement. The sets 550 of alternating dielectric layers and internal electrode layers are spaced apart from one another by a spacing distance t, which may be the same between each set 550 or may be different. For example, a first spacing distance $t_1$ may be defined between a first set 550*a* and a second set 550*b*, a second spacing distance $t_2$ may be defined between the second set 550*b* and a third set 550*c*, and a third spacing distance $t_3$ may be defined between the third set 550*c* and a fourth set 550*d*. The first spacing distance $t_1$ may be the same as the second spacing distance $t_2$ and/or the third spacing distance $t_3$, e.g., at least one of the first spacing distance $t_1$, the second spacing distance $t_2$, and the third spacing distance $t_3$ is different from the other spacing distances $t_1$, $t_2$, $t_3$.

Similar to the embodiments discussed above, the spacing distances "$t_1$", "t2", and/or "$t_3$" between the sets may be from about 0.2 to about 10 μm, in some embodiments from about 0.5 to about 8 μm, and in some embodiments from about 1 to about 5 μm. Additionally, the spacing distances "$t_1$", "$t_2$", and/or "$t_3$" may be, while not limited, is at least 2 times, in some embodiments at least about 3 times, and in embodiments, from about 4 to about 8 times greater than the distance between adjacent lead tabs in a given column to ensure that distinct terminations do not run together.

In general, the electrode layers 202, 204 are configured as described with respect to FIG. 2B. However, the electrode layers 202, 204 also may be configured as described with respect to other embodiments of the capacitor 20. For example, where the external terminations 52*a*, 54*b* extend to along the ends 58*c*, 58*d* of the capacitor 50 (as well as the top surface 58*a* and bottom surface 58*b*), the internal electrode layers 202, 204 may be configured similarly to FIG. 2C, having second electrodes 208 to assist in the formation of the external terminations 52*a*, 54*b*, particularly along the end surfaces 58*c*, 58*d*. Further, it will be appreciated that, for embodiments of the capacitor 50 such as shown in FIG. 5A, the first base section 214-1 of electrode layers 202, 204 may be spaced apart from the end surfaces 58*c*, 58*d* of the capacitor 50, e.g., dielectric material may be disposed along the leading edge (extending along the Z-direction) of the first base section 214-1 to define the entirety of the end surfaces 58*c*, 58*d* of the capacitor 50.

The capacitors 30, 40, 50 each include at least one first polarity termination and at least one second and opposite polarity termination on a top surface and at least one first polarity termination and at least one second and opposite termination on the bottom surface. For instance, FIG. 3A includes two positive terminations 32 and two negative terminations 34 on the top surface 38*a*.

In general, the like polarity terminations on the bottom surface of the capacitor that correspond to a particular set of alternating dielectric layers and internal electrode layers are electrically connected to the like polarity terminations on the top surface of the capacitor. The like polarity terminations located on a top surface and a bottom surface of a capacitor may not be interdigitated. In this regard, corresponding like polarity terminations on a top and a bottom surface may not be offset by a termination position but may instead be positioned directly above or below another like polarity termination on the opposite top or bottom surface. In other words, corresponding like polarity terminations that correspond to a particular set of alternating dielectric layers and internal electrode layers may be substantially aligned. By substantially aligned, it is meant that the offset from a side edge of one lateral edge of a polarity termination on a top surface is within +/−10%, such as within +/−5%, such as within +/−4%, such as within +/−3%, such as within +/−2%, such as within +1-1%, such as within +/−0.5% of the offset from a side edge of a corresponding polarity termination on a bottom surface.

Further, the pitch (i.e., nominal distance between the centers also referred to as center-to-center spacing) of the external terminations generally may be dictated by the particular circuit board configuration. The pitch between external terminations in one direction (i.e., x or y direction) may be the same as the pitch between adjacent external terminations in the other direction (i.e., y or x direction, respectively). That is, the pitch between any two adjacent external terminations may be substantially the same as the pitch between any other two adjacent external terminations.

The pitch may be about 0.1 mm or greater, such as about 0.2 mm or greater, such as about 0.3 mm or greater, such as 0.4 mm or greater, such as about 0.5 mm or greater, such as about 0.6 mm or greater, such as about 0.7 mm or greater, such as about 0.8 mm or greater, such as about 0.9 mm or greater, such as about 1.0 m or greater. The pitch may be about 2.0 mm or less, such as about 1.5 mm or less, such as about 1.4 mm or less, such as about 1.3 mm or less, such as about 1.2 mm or less, such as about 1.1 mm or less, such as about 1.0 mm or less. For instance, the pitch may be about 0.2 mm, about 0.4 mm, about 0.6 mm, about 0.8 mm, about 1.0 mm, about 1.2 mm, etc. In particular, the pitch may be 0.6 mm, 0.8 mm, or 1.0 mm. In one embodiment, the pitch may be about 0.6 mm, such as 0.6 mm+/−10%, such as +/−5%, such as +/−2%, such as +/−1%. In another embodiment, the pitch may be about 0.8 mm, such as 0.8 mm+/−10%, such as +/−5%, such as +/−2%, such as +/−1%. In a further embodiment, the pitch may be about 1 mm, such as 1 mm+/−10%, such as +/−5%, such as +/−2%, such as +/−1%.

In addition, the external terminations may be positioned similar to the configuration of a ball-grid array. For instance, the external terminations may be provided to make contacts as typically employed by a ball-grid array, in particular a surrounding ball-grid array. In this regard, the pitch of the external terminations may be the same as the pitch of a surrounding ball-grid array. That is, the pitch may be within 10%, such as within 5%, such as within 2%, such as within 1%, such as within 0.5%, such as within 0.1% of the pitch of a surrounding ball-grid array.

In addition, like a ball-grid array, the external terminations may be provided in rows and columns. That is, the external terminations may be provided such that they exist in at least two rows and at least two columns. For instance, the external terminations may be presented in at least two rows, such as at least three rows, such as at least four rows. The number of rows can be dictated by the number of different sets of alternating dielectric layers and internal electrode layers. In addition, the external terminations may be presented in at least two columns, such as at least three columns, such as at least four columns. The number of columns can be dictated by the number of different columnar tabs of the internal electrodes.

While the capacitors of FIGS. 3A-5B employ sets of alternating dielectric layers and internal electrode layers 102, 104 or 202, 204, it should be understood that other configurations may also be employed. For instance, the set 350 of alternating dielectric layers and internal electrode layers 102, 104 (e.g., of any of FIGS. 1C-1G) may also be employed in capacitors similar to capacitors 40 and 50 of FIGS. 4A-5B. In this regard, rather than only employing two sets 350 of alternating dielectric layers and internal electrode layers within capacitor 30 of FIGS. 3A-3C, the capacitor may employ up to eight sets 350 of alternating dielectric layers and internal electrode layers 102, 104. For example, capacitor 30 may employ from two to eight sets 350 of alternating dielectric layers and internal electrode layers.

Additionally, the embodiments of the figures employ only four internal electrode layers per set of alternating dielectric layers and internal electrode layers. However, it should be understood that the present invention may include any number of internal electrode layers per set and is not necessarily limited.

In general, the present invention provides a capacitor having a unique configuration that provides various benefits and advantages. In this regard, it should be understood that the materials employed in constructing the capacitor may not be limited and may be any as generally employed in the art and formed using any method generally employed in the art.

Accordingly, FIGS. 3A-5B provide various example arrangements of multiple capacitive elements within a single, unitary package (i.e., single body). For example, each of the capacitors 30 and 40 include two capacitive elements, while the capacitor 50 includes four capacitive elements. However, as described herein, different numbers of capacitive elements can be included within a single capacitive body, such as two, such as three, such as four, such as five, such as six or more capacitive elements.

As previously discussed, the arrangement of multiple capacitive elements within a single, unitary package or single body as described herein can provide several advantages. For instance, such a capacitor may be mounted onto a circuit board as a surface mount capacitor and may provide a smaller footprint on the circuit board, which may also allow for a reduction in size of a circuit board. Further, another advantage of capacitors and configurations utilizing multiple capacitive elements in a single body (e.g., compared to employing a plurality of individual multilayer ceramic capacitors) is the direct power ground connection, where the capacitor can be directly connected to an integrated circuit package and a circuit board, which allows for current to flow through the capacitor and provide a direct power ground connection.

In the embodiments described herein, the internal electrode layers are generally oriented in a vertical configuration. Of course, this is by no means required and it is equally suitable to use other geometric configurations, such as a horizontal configuration.

The disclosed capacitors may be used in a variety of applications. For example, these applications may include those related to communications. These may include 5G, mobile devices, devices requiring high frequency communications, base stations, V2X (vehicle to everything technologies), etc. These applications may also include power trains, safety equipment, ADAs, etc.

EXAMPLE

A multilayer capacitor as defined herein was manufactured according to the specifications disclosed herein. In particular, a 2 by 4 multilayer capacitor was manufactured including two sets of alternating dielectric layers and internal electrode layers. Each internal electrode layer included two lead tabs extending from the top edge and two lead tabs extending from the bottom edge. The capacitor included eight external terminations on a top surface and eight external terminations on a bottom surface with four external terminations on each surface having a first polarity and the remaining four external terminations on each surface having a second and opposite polarity. The capacitor included about 300 active internal electrode layers wherein each layer was distanced from an adjacent internal electrode layer within a set by about 4 microns.

| Sample | Inductance (pH) | Capacitance (µF) | Resistance (mOhm) |
|---|---|---|---|
| 1 | 0.55 | 5 | 2 |
| 2 | 0.55 | 12 | 7 |
| 3 | 0.55 | 12 | 5 |
| 4 | 0.55 | 12 | 5 |

Testing Methods

A testing assembly can be used to test performance characteristics, such as equivalent series resistance, of a capacitor according to aspects of the present disclosure. For example, the capacitor can be mounted to a test board. An input line and an output line can each be connected with the test board. The test board can include microstrip lines, or test traces, electrically connecting the input line and output lines with respective external terminations of the capacitor. The test traces can be spaced apart by about 0.432 mm (0.017 in) or by about 0.610 mm (0.024 in).

An input signal can be applied to the input line using a source signal generator (e.g., a 1806 Keithley 2400 series Source Measure Unit (SMU), for example, a Keithley 2410-C SMU) and the resulting output signal of the capacitor can be measured at the output line (e.g., using the source signal generator). The equivalent series resistance can be determined over a frequency range of from 1 GHz to 10 GHz. This test method can be repeated for multiple capacitors having the same design and nominal dimensions.

These and other modifications and variations of the present invention may be practiced by those of ordinary skill in the art, without departing from the spirit and scope of the present invention. In addition, it should be understood that aspects of the various embodiments may be interchanged both in whole or in part. Further, those of ordinary skill in the art will appreciate that the foregoing description is by way of example only and is not intended to limit the invention so further described in such appended claims.

What is claimed is:

1. A multilayer capacitor having a first end and a second end that is spaced apart from the first end in a longitudinal direction that is perpendicular to a lateral direction, the lateral direction and longitudinal direction each being perpendicular to a Z-direction, the multilayer capacitor comprising:

a body having a top surface and a bottom surface opposing the top surface along the Z-direction, the body containing alternating dielectric layers and electrode layers, the electrode layers including first electrode layers and second electrode layers, each electrode layer including:

a first electrode having a base section, a connecting section, and a central section, a first connecting edge of the connecting section extending from a first leading edge of the base section to a first edge of the central section, and a second connecting edge of the connecting section extending from a second leading edge of the base section to a second edge of the central section; and a plurality of external terminations including a first external termination disposed on at least one of the top surface or the bottom surface and a second external termination disposed on at least one of the top surface or the bottom surface, wherein the first external termination is electrically connected to the first electrode layers along at least one of the first leading edge or the second leading edge of the first electrode of the first electrode layers, wherein the second external termination is electrically connected to the second electrode layers along at least one of the first leading edge or the second leading edge of the first electrode of the second electrode layers, wherein at least a portion of at least one of the first connecting edge or the second connecting edge of the first electrode of the electrode layers is not perpendicular to the respective first edge or second edge of the central section of the first electrode, and wherein the base section of the first electrode has a vertical edge extending in the Z-direction and a length extending in the longitudinal direction, the first external termination has a first lateral edge extending in the lateral direction, and the first lateral edge of the first external termination is within 5% of the vertical edge of the base section based on the length of the base section.

2. The multilayer capacitor of claim 1, wherein the first connecting edge of the connecting section forms a first angle of from greater than 90° to less than 180° with the first edge of the central section.

3. The multilayer capacitor of claim 2, wherein the first angle is from 100° to 160°.

4. The multilayer capacitor of claim 1, wherein the first connecting edge of the connecting section is a linear edge.

5. The multilayer capacitor of claim 1, wherein the first connecting edge of the connecting section is a curved edge.

6. The multilayer capacitor of claim 1, wherein the second connecting edge of the connecting section forms a second angle of from greater than 90° to less than 180° with the second edge of the central section.

7. The multilayer capacitor of claim 6, wherein the second angle is from 100° to 160°.

8. The multilayer capacitor of claim 1, wherein the second connecting edge of the connecting section is a linear edge.

9. The multilayer capacitor of claim 1, wherein the second connecting edge of the connecting section is a curved edge.

10. The multilayer capacitor of claim 1, wherein the base section includes a first vertical edge, and wherein the first vertical edge of the base section forms a second angle of from greater than 90° to less than 180° with the first connecting edge of the connecting section.

11. The multilayer capacitor of claim 10, wherein the second angle is from 100° to 160°.

12. The multilayer capacitor of claim 1, wherein the base section includes a second vertical edge, and wherein the first vertical edge of the base section forms a second angle of from greater than 90° to less than 180° with the second connecting edge of the connecting section.

13. The multilayer capacitor of claim 12, wherein the second angle is from 100° to 160°.

14. The multilayer capacitor of claim 1, wherein the body has a body length in the longitudinal direction between the first end and the second end of the multilayer capacitor and wherein the first external termination has a first lateral edge and the second external termination has a second lateral edge, wherein the second lateral edge is offset in the longitudinal direction from the first lateral edge by an external termination gap distance, wherein a ratio of the body length to the external termination gap distance is from 0.2 to 0.8.

15. The multilayer capacitor of claim 1, wherein the multilayer capacitor is symmetric in the lateral direction about a longitudinal centerline that extends in the longitudinal direction.

16. The multilayer capacitor of claim 1, wherein the multilayer capacitor is symmetric in the Z-direction about a lateral centerline that extends in the lateral direction.

17. The multilayer capacitor of claim 1, wherein the multilayer capacitor is configured for mounting to a mounting surface such that the electrode layers are perpendicular with the mounting surface.

18. The multilayer capacitor of claim 1, wherein each electrode layer further comprises a second electrode co-planar with the first electrode.

19. The multilayer capacitor of claim 18, wherein a central end gap distance is formed in the longitudinal direction between the central section of the first electrode and a base section of the second electrode.

20. The multilayer capacitor of claim 19, wherein the central end gap distance is from 2% to 40% a length of the body of the capacitor.

21. The multilayer capacitor of claim 19, wherein the central end gap distance is from 5% to 40% of a length of the central section of the first electrode.

22. The multilayer capacitor of claim 18, wherein the second electrode extends from 5% to 50% a length of the body of the capacitor.

23. The multilayer capacitor of claim 1, wherein the central section of the first electrode extends 40% to less than 100% a length of the body of the capacitor.

24. The multilayer capacitor of claim 23, wherein the central section extends 50% to less than 100% the length of the body of the capacitor.

25. The multilayer capacitor of claim 1, wherein the first electrode comprises copper.

26. The multilayer capacitor of claim 1, wherein each electrode layer further comprises a second electrode, and wherein the first electrode and the second electrode comprise copper.

27. The multilayer capacitor of claim 1, wherein the plurality of dielectric layers comprise an NPO material.

28. The multilayer capacitor of claim 1, wherein the plurality of dielectric layers comprise a titanate.

29. The multilayer capacitor of claim 28, wherein the plurality of dielectric layers further comprise an oxide.

30. The multilayer capacitor of claim 1, wherein the first connecting edge is a rounded corner and the second connecting edge is a rounded corner.

31. The multilayer capacitor of claim 30, wherein at least one electrode layer further comprises a second electrode co-planar with the first electrode.

32. The multilayer capacitor of claim 31, wherein the second electrode has at least one rounded corner.

33. The multilayer capacitor of claim 32, wherein the second electrode is of a generally rectangular configuration.

34. The multilayer capacitor of claim 31, wherein a gap is present between the first electrode and the second electrode.

35. The multilayer capacitor of claim 34, wherein the gap is from 2% to 40% a length of the body of the capacitor.

36. The multilayer capacitor of claim 34, wherein the gap is from 5% to 40% of a length of the main body of the first electrode.

37. The multilayer capacitor of claim 31, wherein the second electrode extends from 5% to 50% a length of the body of the capacitor.

38. The multilayer capacitor of claim 30, wherein the central section of the first electrode extends 40% to less than 100% a length of the body of the capacitor.

39. The multilayer capacitor of claim 38, wherein the central section extends 50% to less than 100% the length of the body of the capacitor.

40. The multilayer capacitor of claim 1, wherein the plurality of external terminations includes more than two external terminations disposed in a linear fashion.

41. The multilayer capacitor of claim 1, wherein the plurality of dielectric layers and the plurality of electrode layers include a first set of layers and a second set of layers, wherein the first set of layers comprises a first portion of the plurality of dielectric layers alternatingly stacked with a first portion of the plurality of electrode layers and the second set of layers comprises a second portion of the plurality of dielectric layers alternatingly stacked with a second portion of the plurality of electrode layers.

42. The multilayer capacitor of claim 41, wherein a spacing distance is defined between the first set of layers and the second set of layers.

43. The multilayer capacitor of claim 1, wherein the capacitor includes at least three sets of alternating dielectric layers and electrode layers.

44. A circuit board, comprising:

an integrated circuit package; and a multilayer capacitor positioned on the circuit board, the multilayer capacitor having a first end and a second end that is spaced apart from the first end in a longitudinal direction that is perpendicular to a lateral direction, the lateral direction and longitudinal direction each being perpendicular to a Z-direction, the multilayer capacitor comprising:

a body having a top surface and a bottom surface opposing the top surface along the Z-direction, the body containing alternating dielectric layers and electrode layers, the electrode layers including first electrode layers and second electrode layers, each electrode layer including:

a first electrode having a base section, a connecting section, and a central section, a first connecting edge of the connecting section extending from a first leading edge of the base section to a first edge of the central section, and a second connecting edge of the connecting section extending from a second leading edge of the base section to a second edge of the central section; and a plurality of external terminations including a first external termination disposed on at least one of the top surface or the bottom surface and a second external termination disposed on at least one of the top surface or the bottom surface, wherein the first external termination is electrically connected to the first electrode layers along at least one of the first leading edge or the second leading edge of the first electrode of the first electrode layers, wherein the second external termination is electrically connected to the second electrode layers along at least one of the first leading edge or the second leading edge of the first electrode of the second electrode layers, wherein at least a portion of at least one of the first connecting edge or the second connecting edge of the first electrode of the electrode layers is not perpendicular to the respective first edge or second edge of the central section of the first electrode, wherein the multilayer capacitor is positioned between the circuit board and the integrated circuit package in a vertical direction such that the circuit board, the multilayer capacitor, and the integrated circuit package are present in a stacked arrangement, and wherein the multilayer capacitor is directly connected to the circuit board and the integrated circuit package.

45. A multilayer capacitor having a first end and a second end that is spaced apart from the first end in a longitudinal direction that is perpendicular to a lateral direction, the lateral direction and longitudinal direction each being perpendicular to a Z-direction, the multilayer capacitor comprising:

a body having a top surface and a bottom surface opposing the top surface along the Z-direction, the body containing alternating dielectric layers and electrode layers, the electrode layers including first electrode layers and second electrode layers, each electrode layer including:

a first electrode having a base section, a connecting section, and a central section, the base section including a vertical edge, a first connecting edge of the connecting section extending from a first leading edge of the base section to a first edge of the central section, and a second connecting edge of the connecting section extending from a second leading edge of the base section to a second edge of the central section, and wherein each of the first leading edge and the second leading edge intersect the vertical edge such that the first leading edge, the second leading edge, and the vertical edge define the boundaries of the base section; and a plurality of external terminations including a first external termination disposed on at least one of the top surface or the bottom surface and a second external termination disposed on at least one of the top surface or the bottom surface, wherein the first external termination is electrically connected to the first electrode layers along at least one of the first leading edge or the second leading edge of the first electrode of the first electrode layers, wherein the second external termination is electrically connected to the second electrode layers along at least one of the first leading edge or the second leading edge of the first electrode of the second electrode layers, and wherein the first connecting edge is not perpendicular to the first edge of the central section of the first electrode and the second connecting edge is not perpendicular to the second edge of the central section of the first electrode.

46. The multilayer capacitor of claim 45, wherein the first electrode of each electrode layer of the first and second electrode layers is a Y-shaped electrode.

47. The multilayer capacitor of claim 45, wherein the base section is a first base section, the connecting section is a first connecting section, and the central section is a first central section, wherein the first electrode further comprises a second base section, a second connecting section, and a second central section, and wherein:

a first connecting edge of the second connecting section extends from a first leading edge of the second base section to a first edge of the second central section, a second connecting edge of the second connecting section extends from a second leading edge of the second base section to a second edge of the second central section, and each of the first leading edge and the second leading edge of the second base section intersect a vertical edge of the second base section such that the first leading edge, the second leading edge, and the vertical edge of the second base section define the boundaries of the second base section.

48. The multilayer capacitor of claim 47, wherein the vertical edge of the second base section extends from the first edge and the second edge of the first central section.

* * * * *